(12) United States Patent
Oshima

(10) Patent No.: US 7,839,443 B2
(45) Date of Patent: Nov. 23, 2010

(54) IMAGING APPARATUS AND SIGNAL PROCESSING METHOD FOR CORRECTING DETERIORATION OF THE IMAGE SIGNAL

(75) Inventor: Hiroyuki Oshima, Asaka (JP)

(73) Assignee: FujiFilm Corporation, Tokyo (JP)

( * ) Notice: Subject to any disclaimer, the term of this patent is extended or adjusted under 35 U.S.C. 154(b) by 434 days.

(21) Appl. No.: 11/951,144

(22) Filed: Dec. 5, 2007

(65) Prior Publication Data

US 2009/0009616 A1    Jan. 8, 2009

(30) Foreign Application Priority Data

Dec. 6, 2006    (JP) ............................ P2006-329510

(51) Int. Cl.
*H04N 3/14* (2006.01)
*H04N 5/335* (2006.01)
(52) U.S. Cl. .................................. 348/311; 348/222.1
(58) Field of Classification Search ............ 348/222.1, 348/241, 247, 248, 249, 250, 251, 254, 294, 348/311, 313, 314, 318, 324; 250/208.1; 365/222

See application file for complete search history.

(56) References Cited

U.S. PATENT DOCUMENTS

2005/0036040 A1* 2/2005 Honda et al. ............. 348/222.1

2007/0040916 A1* 2/2007 Ashida et al. ............ 348/222.1
2007/0064136 A1* 3/2007 Kobayashi .................. 348/311

FOREIGN PATENT DOCUMENTS

| JP | 4-217171 A | 8/1992 |
| JP | 5-219373 A | 8/1993 |
| JP | 2004-327722 A | 11/2004 |
| JP | 2004-356878 A | 12/2004 |

* cited by examiner

*Primary Examiner*—Nelson D. Hernández Hernández
(74) *Attorney, Agent, or Firm*—Birch, Stewart, Kolasch & Birch, LLP

(57) ABSTRACT

An imaging apparatus which enables correction of signal deterioration responsible for transfer deterioration occurred in a horizontal charge transfer path is provided. Provided that positions of "n" transfer packet formed in a horizontal charge transfer path in correspondence to "n" vertical charge transfer paths are expressed as a coordinate "i" (i=1, 2, 3, . . . n), a solid-state imaging device is exposed under exposure conditions, and reference charges generated in photoelectric conversion elements upon the exposure are accumulated in transfer packets located at odd coordinates. The charge accumulation packets accumulating the reference charges and other empty packets are transferred horizontally, whereby a reference signal responsive to the reference charge and an untransferred signal responsive to a charge in the empty packet are output. The thus-output signals are stored in memory. Deterioration of an imaging signal S(i) responsive to the charge accumulated in the transfer packet located at the coordinate "i" in a photographing mode during exposure is compensated for in accordance with the data stored in the memory and the imaging signal S(i).

11 Claims, 18 Drawing Sheets

FIG. 5

| EXPOSURE CONDITION | REFERENCE SIGNAL LEVEL | UNTRANSFERRED SIGNAL LEVEL | COORDINATE "i" OF INITIAL POSITION |
|---|---|---|---|
| R1 | A | a1 | 1 |
| | | a3 | 3 |
| | | a5 | 5 |
| | | a7 | 7 |
| R2 | B | b1 | 1 |
| | | b3 | 3 |
| | | b5 | 5 |
| | | b7 | 7 |
| R3 | C | c1 | 1 |
| | | c3 | 3 |
| | | c5 | 5 |
| | | c7 | 7 |
| R4 | D | d1 | 1 |
| | | d3 | 3 |
| | | d5 | 5 |
| | | d7 | 7 |

FIG. 6

| EXPOSURE CONDITION | REFERENCE SIGNAL LEVEL | UNTRANSFERRED SIGNAL LEVEL | COORDINATE "i" OF INITIAL POSITION |
|---|---|---|---|
| R1 | A | a1 | 1 |
| | | a2 | 2 |
| | | a3 | 3 |
| | | a4 | 4 |
| | | a5 | 5 |
| | | a6 | 6 |
| | | a7 | 7 |
| R2 | B | b1 | 1 |
| | | b2 | 2 |
| | | b3 | 3 |
| | | b4 | 4 |
| | | b5 | 5 |
| | | b6 | 6 |
| | | b7 | 7 |
| R3 | C | c1 | 1 |
| | | c2 | 2 |
| | | c3 | 3 |
| | | c4 | 4 |
| | | c5 | 5 |
| | | c6 | 6 |
| | | c7 | 7 |
| R4 | D | d1 | 1 |
| | | d2 | 2 |
| | | d3 | 3 |
| | | d4 | 4 |
| | | d5 | 5 |
| | | d6 | 6 |
| | | d7 | 7 |

FIG. 16

| EXPOSURE CONDITION | REFERENCE SIGNAL LEVEL Q1 | UNTRANSFERRED SIGNAL LEVEL q1 | UNTRANSFERRED SIGNAL LEVEL q2 | COORDINATE "i" OF INITIAL POSITION |
|---|---|---|---|---|
| R1 | A | a1 | a'1 | 1 |
| | | | | |
| | | | | |
| | | | | |
| | | a5 | a'5 | 5 |
| | | | | |
| | | | | |
| | | | | |
| | | a9 | a'9 | 9 |
| | | | | |
| | | | | |
| | | | | |
| | | a13 | a'13 | 13 |
| R2 | B | b1 | b'1 | 1 |
| | | | | |
| | | | | |
| | | | | |
| | | b5 | b'5 | 5 |
| | | | | |
| | | | | |
| | | | | |
| | | b9 | b'9 | 9 |
| | | | | |
| | | | | |
| | | | | |
| | | b13 | b'13 | 13 |

FIG. 17

| EXPOSURE CONDITION | REFERENCE SIGNAL LEVEL Q2 | UNTRANSFERRED SIGNAL LEVEL q3 | UNTRANSFERRED SIGNAL LEVEL q4 | COORDINATE "i" OF INITIAL POSITION |
|---|---|---|---|---|
| R1 | C | c1 | c'1 | 1 |
|  |  |  |  |  |
|  |  |  |  |  |
|  |  |  |  |  |
|  |  | c5 | c'5 | 5 |
|  |  |  |  |  |
|  |  |  |  |  |
|  |  |  |  |  |
|  |  | c9 | c'9 | 9 |
|  |  |  |  |  |
|  |  |  |  |  |
|  |  |  |  |  |
|  |  | c13 | c'13 | 13 |
| R2 | D | d1 | d'1 | 1 |
|  |  |  |  |  |
|  |  |  |  |  |
|  |  |  |  |  |
|  |  | d5 | d'5 | 5 |
|  |  |  |  |  |
|  |  |  |  |  |
|  |  |  |  |  |
|  |  | d9 | d'9 | 9 |
|  |  |  |  |  |
|  |  |  |  |  |
|  |  |  |  |  |
|  |  | d13 | d'13 | 13 |

FIG. 18

| EXPOSURE CONDITION | REFERENCE SIGNAL LEVEL Q1 | UNTRANSFERRED SIGNAL LEVEL q1 | UNTRANSFERRED SIGNAL LEVEL q2 | COORDINATE "i" OF INITIAL POSITION |
|---|---|---|---|---|
| R1 | A | a1 | a'1 | 1 |
| | | a2 | a'2 | 2 |
| | | a3 | a'3 | 3 |
| | | a4 | a'4 | 4 |
| | | a5 | a'5 | 5 |
| | | a6 | a'6 | 6 |
| | | a7 | a'7 | 7 |
| | | a8 | a'8 | 8 |
| | | a9 | a'9 | 9 |
| | | a10 | a'10 | 10 |
| | | a11 | a'11 | 11 |
| | | a12 | a'12 | 12 |
| | | a13 | a'13 | 13 |
| R2 | B | b1 | b'1 | 1 |
| | | b2 | b'2 | 2 |
| | | b3 | b'3 | 3 |
| | | b4 | b'4 | 4 |
| | | b5 | b'5 | 5 |
| | | b6 | b'6 | 6 |
| | | b7 | b'7 | 7 |
| | | b8 | b'8 | 8 |
| | | b9 | b'9 | 9 |
| | | b10 | b'10 | 10 |
| | | b11 | b'11 | 11 |
| | | b12 | b'12 | 12 |
| | | b13 | b'13 | 13 |

IMAGING APPARATUS AND SIGNAL PROCESSING METHOD FOR CORRECTING DETERIORATION OF THE IMAGE SIGNAL

BACKGROUND OF THE INVENTION

1. Field of the Invention

The present invention relates to an imaging apparatus having a plurality of photoelectric conversion elements arranged in a semiconductor substrate; a solid-state imaging device including "n" ("n" is a natural number of two or greater) vertical charge transfer paths for vertically transferring charges generated in the plurality of respective photoelectric conversion elements, a horizontal charge path for horizontally transferring the charges transferred through the "n" vertical charge transfer paths in a horizontal direction orthogonal to the vertical direction, and an output section for outputting a signal corresponding to the charges transferred through the horizontal charge transfer path; and a signal processing section for making a correction to a signal output from the solid-state imaging device.

2. Description of Related Art

The solid-state imaging device having the foregoing configuration encounters difficulty in achieving 100% for transfer efficiency of a horizontal charge transfer path. Therefore, in a case where attention is paid to a certain charge, when the charge of interest is transferred through the horizontal charge transfer path, not the entirety of the charge is transferred, and some of the charge remain as an untransferred charge. Various methods for making a correction to such deterioration of transfer efficiency or signal deterioration attributable thereto have been proposed (see; e.g., JP-A-2004-356878, JP-A-2004-327722, JP-A-4-217171 and JP-A-5-219373).

SUMMARY OF THE INVENTION

An object of an illustrative, non-limiting embodiment of the invention is to provide an imaging apparatus capable of making a correction to signal deterioration responsible for transfer deterioration of a horizontal charge transfer path by means of a new technique completely differing from the techniques described in the above documents.

According to an aspect of the invention, there is provided an imaging apparatus including:
a solid-state imaging device including
a semiconductor substrate,
a plurality of photoelectric conversion elements arranged in the semiconductor substrate,
n vertical charge transfer paths that transfers, in a vertical direction, charges generated in the respective photoelectric conversion elements, wherein n is a natural number of two or more,
a horizontal charge transfer path that transfers, in a horizontal direction orthogonal to the vertical direction, the charges transferred through the n vertical charge transfer path, and
an output section that outputs a signal responsive to the charges transferred through the horizontal charge transfer path
wherein the horizontal charge transfer path has n transfer packets in regions corresponding to the n vertical transfer paths, provided that each of positions of the n transfer packets are expressed as a coordinate i of a natural number of 1 to n with reference to a position of a transfer packet located closest to the output section;
a signal processing section that makes a correction to the signal output from the solid-state imaging device; and
a storage medium that stores data associating a reference signal and an untransferred signal for each of a plurality of exposure conditions, wherein the data associating the reference signal with the untransferred signal for an exposure condition are stored in such a way that:
a first drive unit performs a first drive operation for exposing the solid-state imaging device under the exposure condition to generate reference charges in the photoelectric conversion elements and accumulating the reference charges in a subset of the n transfer packets, wherein when a transfer packet in the subset accumulating the reference charges are taken as a charge accumulation packet and a transfer packet other than the subset are taken as an empty packet, the solid-state imaging device is driven in such a way that at least one empty packet corresponds to the charge accumulation packet and is formed upstream next to the charge accumulation packet in the horizontal direction;
a second drive unit that performs a second drive operation for transferring, in the horizontal direction, the charge accumulation packet and the empty packet to cause the output section to output a reference signal commensurate with the reference charge in the charge accumulation packet and an untransferred signal commensurate with a charge that is present in an empty packet corresponding to the charge accumulation packet and that has been left from the charge accumulation packet; and
a storage control unit that produce the data associating the reference signal with the untransferred signal and stores the data in the storage medium,
wherein the signal processing section corrects deterioration of an imaging signal $S(i)$ responsive to a charge accumulated in the transfer packet at a coordinate i upon exposure in a photographing mode, based on the data stored in the storage medium and the imaging signal $S(i)$, the deterioration being responsible for a charge transfer failure in the horizontal charge transfer path.

In the imaging apparatus, the data stored in the storage medium may include: a plurality of untransferred signals among untransferred signals output from the solid-state imaging device upon the exposure; and a coordinate of the charge accumulation packet that is a source of output of the reference signal corresponding to each of the plurality of untransferred signal, the coordinate being achieved before initiation of transfer of the charge accumulation packet. Further, the signal processing section may include: an untransferred signal generation unit that interpolates an untransferred signal corresponding to a coordinate other than the coordinate included in the data, with respect to the data stored in the storage medium, so as to produce an interpolated data, and that generates a signal $Y(i)$ of the untransferred signal corresponding to a coordinate and a signal level of the transfer packet serving as a source of output of the imaging signal $S(i)$, from the imaging signal $S(i)$ and a correction function, wherein the correction function is generated from the interpolated data by a correction function generation unit that generates for each of coordinates the correction function expressing the untransferred signal as a function of the reference signal; and a correction unit that performs arithmetic operation for adding the signal $Y(i)$ to the imaging signal $S(i)$ and arithmetic operation for subtracting the signal $Y(i-1)$ from the imaging signal $S(i)$, so as to correct the deterioration of the imaging signal $S(i)$.

The imaging apparatus may further include a temperature detection unit that detects a temperature of the solid-state imaging device. The storage control unit may store, in the storage medium, information on the temperature of the solid-state imaging device achieved during exposure, in association with the reference signal, and the untransferred signal generation unit may generate the signal Y(i) from the information on a temperature during exposure in the photographing mode as well as the imaging signal S(i) and the correction function.

In the imaging apparatus, the storage control unit may store, in the storage medium, information on a drive frequency of the horizontal charge transfer path achieved during exposure, in association with the reference signal, and the untransferred signal generation units may generate the signal Y(i) from the information on a drive frequency during exposure in the photographing mode as well as the imaging signal S(i) and the correction function.

In the imaging apparatus, the horizontal charge transfer path may include a charge branch path located downward in the horizontal direction with respect to an area where a transfer packet at a coordinate i=1 is to be formed, and may be divided into a first horizontal charge transfer path, a second horizontal charge path, and a third horizontal charge path by way of the charge branch path, the third horizontal charge transfer path being located upstream with respect to the charge branch path in the horizontal direction. The horizontal charge transfer path may be driven in such a way that the transfer packet in the third horizontal charge transfer path is transferred alternately to the first horizontal charge transfer path and the second horizontal charge transfer path. The output section may include a first output section connected to the first horizontal charge transfer path; and a second output section connected to the second horizontal charge transfer path, and the first drive unit may drive the solid-state imaging device in such a way that at least two empty packets correspond to the charge accumulation packet and are formed upward next to the charge accumulation packet in the horizontal direction.

In the imaging apparatus, the at least two empty packets may be a first empty packet that is an empty packet next to the charge accumulation packet and a second empty packet that is an empty packet next to the first empty packet. The first drive unit may perform the first driving operation twice under the same exposure condition. The second drive unit may perform a third driving operation for transferring the charge accumulation packet formed in one of twice sessions of the first driving operation to the first horizontal charge transfer path and a fourth driving operation for transferring the charge accumulation packet formed by the other of the twice sessions of the first driving operation to the second horizontal charge transfer path. The storage control unit may store: in the storage medium, a plurality of sets of first data for which a first reference signal acquired from the charge accumulation packet by means of the third driving operation, a first untransferred signal acquired from the first empty packet corresponding to the charge accumulation packet, a second untransferred signal obtained from the second empty packet corresponding to the charge accumulation packet, and a coordinate of the initial position of the charge accumulation packet are associated with one another; and a plurality of sets of second data for which a second reference signal acquired from the charge accumulation packet by means of the fourth driving operation, a third untransferred signal acquired from the first empty packet corresponding to the charge accumulation packet, a fourth untransferred signal obtained from the second empty packet corresponding to the charge accumulation packet, and the coordinate of the initial position of the charge accumulation packet are associated with one another. The signal processing unit may include: a first untransferred signal generation unit that interpolates the first untransferred signal and the second untransferred signal which correspond to coordinates other than coordinates stored in the storage medium, with respect to the first data, so as to produce a first interpolated data, and that generates a signal $Y_{11}(i)$ of the first untransferred signal corresponding to a coordinate and signal level of the transfer packet serving as a source of output of the imaging signal S(i) and a signal $Y_{12}(i)$ of the second untransferred signal corresponding to a coordinate and signal level of the transfer packet serving as a source of output of the imaging signal S(i), from the imaging signal S(i) output from the first horizontal charge transfer path and a first correction function, wherein the first correction function is generated from the first interpolated data by a first correction function generation unit that generates for each of coordinates the first correction function expressing the first untransferred signal and the second untransferred signal as a function of the first reference signal; a second untransferred signal generation unit that interpolates the third untransferred signal and the fourth untransferred signal corresponding to coordinates other than coordinates stored in the storage medium, with respect to the second data, so as to produce a second interpolated data, and that generates a signal $Y_{21}(i)$ of the third untransferred signal corresponding to a coordinate and signal level of the transfer packet serving as a source of output of the imaging signal S(i) and a signal $Y_{22}(i)$ of the fourth untransferred signal corresponding to a coordinate and signal level of the transfer packet serving as a source of output of the imaging signal S(i), from the imaging signal S(i) output from the second horizontal charge transfer path and a second correction function, wherein the second correction function is generated from the second interpolated data by a second correction function generation unit that generates for each of the coordinates the second correction function expressing the third untransferred signal and the fourth untransferred signal as a function of the second reference signal; and a correction unit that performs arithmetic operation for adding the signal $Y_{11}(i)$ and the signal $Y_{12}(i)$ to the imaging signal S(i) output from the first horizontal charge transfer path, arithmetic operation for subtracting the signal $Y_{11}(i-1)$ and the signal $Y_{12}(i-2)$ from the imaging signal S(i) output from the first horizontal charge transfer path, arithmetic operation for adding the signal $Y_{21}(i)$ and the signal $Y_{22}(i)$ to the imaging signal S(i) output from the second horizontal charge transfer path, and arithmetic operation for subtracting the signal $Y_{21}(i-1)$ and the signal $Y_{22}(i-2)$ from the imaging signal S(i) output from the second horizontal charge transfer path, so as to correct the deterioration of the imaging signal S(i) responsible for transfer deterioration occurred in the first horizontal charge transfer path, the second horizontal charge transfer path, and the third horizontal charge transfer path.

The imaging apparatus may further include a temperature detection unit that detecting a temperature of the solid-state imaging device. The storage control unit may store, in the storage medium, information on the temperature of the solid-state imaging device achieved during exposure, in association with the first reference signal and the second reference signal. The first untransferred signal generation unit may generate the signal $Y_{11}(i)$ and the signal $Y_{12}(i)$ from the information on a temperature during exposure in the photographing mode as well as the imaging signal S(i) output from the first horizontal charge transfer path and the first correction function, and the second untransferred signal generation unit may generate the signal $Y_{21}(i)$ and the signal $Y_{22}(i)$ from the information on a temperature during exposure in the photographing mode during exposure as well as the imaging signal S(i) output from the first horizontal charge transfer path and the second correction function.

In the imaging apparatus, the storage control unit may store, in the storage medium, information on a drive frequency of the horizontal charge transfer path achieved during exposure, in association with the reference signal and the second reference signal. The first untransferred signal generation unit may generate the signal $Y_{11}(i)$ and the signal $Y_{12}(i)$ from the information on a drive frequency during exposure in the photographing mode as well as the imaging signal S(i) output from the first horizontal charge transfer path and the first correction function, and the second untransferred signal generation unit may generate the signal $Y_{21}(i)$ and the signal $Y_{22}(i)$ from the information on a drive frequency during exposure in the photographing mode as well as the imaging signal S(i) output from the first horizontal charge transfer path and the second correction function.

The imaging apparatus may further include the first drive unit, the second drive unit, and the storage control unit.

The imaging apparatus may further include the first drive unit, the second drive unit, the storage unit, the first correction function generation unit, and the second correction function generation unit.

According to an aspect of the invention, there is provided a method for processing a signal output from a solid-state imaging device, the solid-state imaging device including:

a semiconductor substrate;

a plurality of photoelectric conversion elements arranged in the semiconductor substrate;

n vertical charge transfer paths that transfers, in a vertical direction, charges generated in the respective photoelectric conversion elements, wherein n is a natural number of two or more;

a horizontal charge transfer path that transfers, in a horizontal direction orthogonal to the vertical direction, the charges transferred through the n vertical charge transfer path; and an output section that outputs the signal responsive to the charges transferred through the horizontal charge transfer path, wherein the horizontal charge transfer path has n transfer packets in regions corresponding to the n vertical transfer paths, provided that each of positions of the n transfer packets are expressed as a coordinate i of a natural number of 1 to n with reference to a position of a transfer packet located closest to the output section, the method including:

exposing the solid-state imaging device under an exposure condition to generate reference charge in the photoelectric conversion elements and accumulating the reference charges in a subset of the n transfer packets, wherein when a transfer packet in the subset accumulating the reference charges are taken as a charge accumulation packet and a transfer packet other than the subset are taken as an empty packet, the solid-state imaging device is driven in such a way that at least one empty packet corresponds to the charge accumulation packet and is formed upstream next to the charge accumulation packet in the horizontal direction;

transferring, in the horizontal direction, the charge accumulation packet and the empty packet to cause the output section to output a reference signal commensurate with the reference charge in the charge accumulation packet and an untransferred signal commensurate with a charge that is present in an empty packet corresponding to the charge accumulation packet and that has been left from the charge accumulation packet;

storing data associating the reference signal with the untransferred signal in a storage medium; and correcting deterioration of an imaging signal S(i) responsive to a charge accumulated in the transfer packet at a coordinate i upon exposure in a photographing mode, based on the data stored in the storage medium and the imaging signal S(i), the deterioration being responsible for a charge transfer failure in the horizontal charge transfer path.

BRIEF DESCRIPTION OF THE DRAWINGS

The features of the invention will appear more fully upon consideration of the exemplary embodiments of the inventions, which are schematically set forth in the drawings, in which:

FIG. 5 is a view showing an example table stored in memory provided within a signal processing section of the digital camera shown in FIG. 1;

FIG. 6 is a view showing a table in which data are interpolated into the table shown in FIG. 5;

FIG. 16 is an example table stored in memory provided in the signal processing section of the digital camera shown in FIG. 8;

FIG. 17 is an example table stored in memory provided in the signal processing section of the digital camera shown in FIG. 8;

FIG. 18 is a view showing a table in which data are interpolated into the table shown in FIG. 16.

DETAILED DESCRIPTION OF THE EXEMPLARY EMBODIMENTS

According to an exemplary embodiment of the present invention, there can be provided an imaging apparatus capable of correcting signal deterioration responsible for transfer deterioration occurred in a horizontal charge transfer path by means of a new technique totally differing from the techniques described in the foregoing publications.

Exemplary embodiments of the present invention will be described hereunder by reference to the drawings.

First Embodiment

Figure 1:
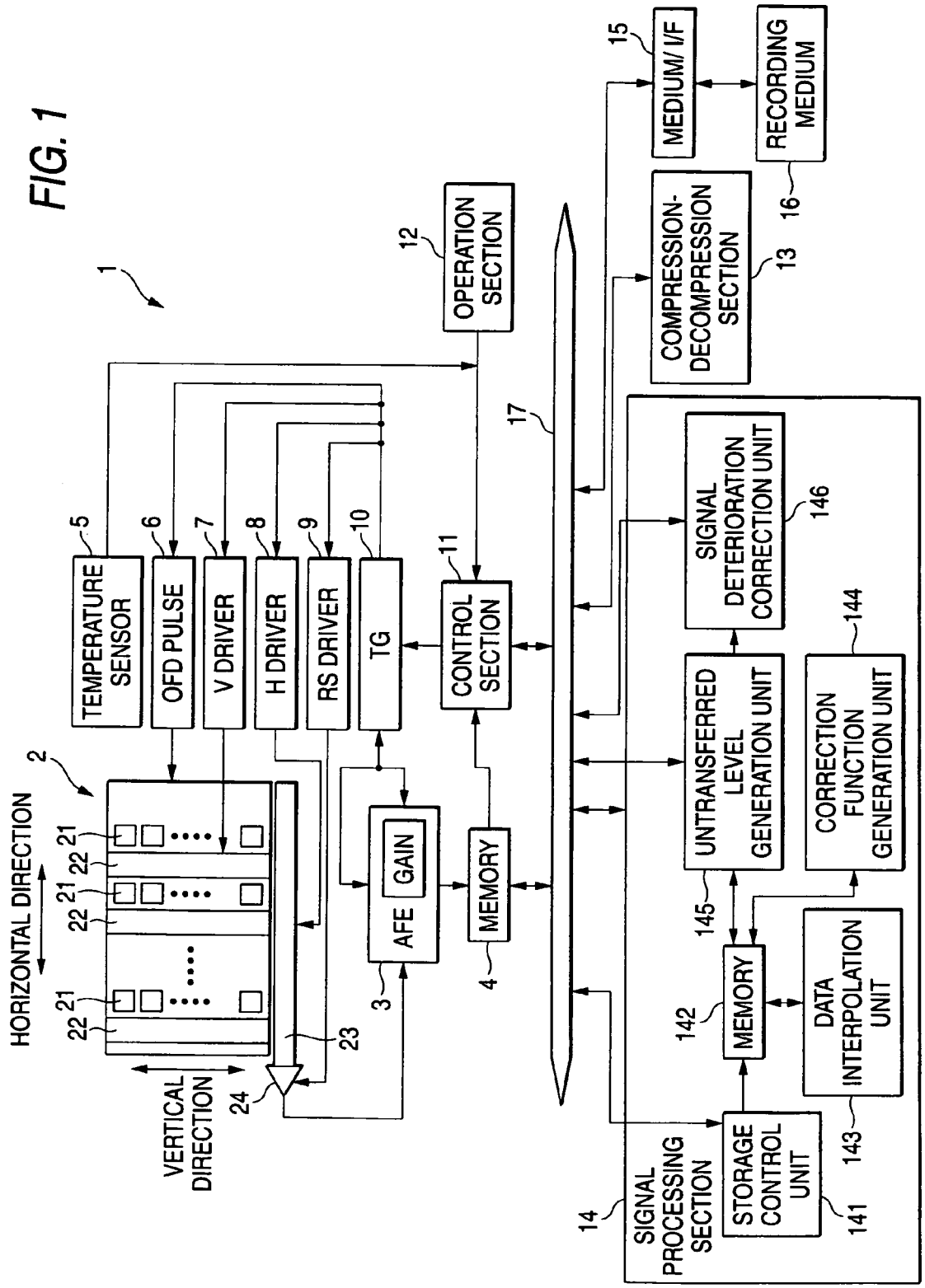
FIG. 1 is a view showing a configuration of a digital camera which is a first exemplary embodiment of an imaging apparatus of the present invention.

FIG. 1 is a view showing the general configuration of a digital camera which is a first exemplary embodiment of an imaging apparatus of the present invention.

A digital camera 1 shown in FIG. 1 has a solid-state imaging device 2; an analogue front end (AFE) 3 which subjects an analogue imaging signal output from the solid-state imaging device 2 to analogue signal processing and which subsequently converts the analogue signal into a digital signal; and memory 4, such as RAM, for temporarily storing the digital signal converted by the AFE 3.

The solid-state imaging device 2 has a plurality of photoelectric conversion elements 21 arranged on a surface of a semiconductor substrate; "n" ("n" is a natural number of two or more) vertical charge transfer paths 22 for vertically transferring charges generated in the respective photoelectric conversion elements 21; a horizontal charge transfer path 23 for transferring the charges transferred through the "n" vertical charge transfer paths 22 in a horizontal direction orthogonal to the vertical direction; and an FD amplifier 24 for outputting a signal responsive to the charges transferred through the horizontal charge transfer path 23.

The vertical charge transfer paths 22 are formed from a buried channel, and a plurality of unillustrated vertical transfer electrodes are formed on the vertical charge transfer paths 22 while being arranged in a vertical direction. Operation for transferring charges through the vertical charge transfer paths 22 is controlled as a result of the vertical transfer electrodes being supplied with a vertical drive pulse (V pulse). The horizontal charge transfer path 23 is formed from a buried channel, and a plurality of unillustrated horizontal transfer electrodes are formed on the horizontal charge transfer path while being arranged in the horizontal direction. Operation for transferring the charges through the horizontal charge transfer path 23 is controlled as a result of the horizontal transfer electrodes being supplied with a two-phase horizontal drive pulse (H pulse).

The digital camera 1 has a control section 11 for controlling the entirety of the digital camera 1 in a centralized manner; a temperature sensor 5 which notifies the temperature of a periphery of the solid-state imaging device 2; an OFD pulse supply section 6 for supplying an overflow drain pulse (OFD) to the solid-state imaging device 2; a V driver 7 for supplying the V pulse to the vertical transfer electrodes; an H driver 8 for supplying the H pulse to the horizontal transfer electrodes; an RS driver 9 for controlling resetting operation of an FD amplifier 24; a timing generator (TG) 10 which generates a timing signal for determining activation timing of the AFE 3, the OFD pulse supply section 6, the V driver 7, the H driver 8, and the RS driver 9; an operation section 12 connected to a control section 11 for setting various operation modes of the digital camera 1; a signal processing section 14 which subjects the imaging signal stored in the memory 4 to digital signal processing; a compression-decompression processing section 13; a medium IF 15; and a recording medium 16 connected to the medium IF 15. Each of the signal processing section 14, the compression-decompression processing section 13, the medium IF 15, the memory 4, the control section 11 are connected to a bus 17.

Figure 2:
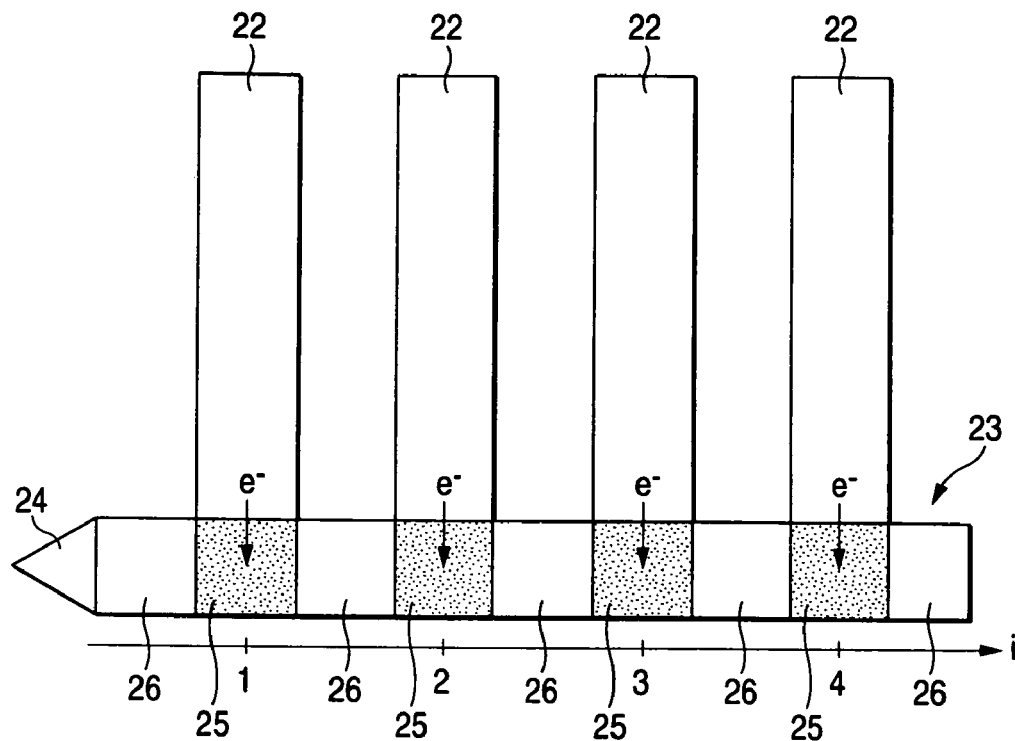
FIG. 2 is an enlarged view of the periphery of a horizontal charge transfer path and an FD amplifier of a solid-state imaging device shown in FIG. 1.

FIG. 2 is an enlarged view of the periphery of the horizontal charge transfer path 23 and the FD amplifier 24 of the solid-state imaging device 2 shown in FIG. 1. FIG. 2 shows a state where charges are transferred from the vertical charge transfer paths 22 to the horizontal charge transfer path 23.

Provided that portions of the horizontal charge transfer path 23 overlapping the horizontal transfer electrodes located in the vertical direction from the horizontal charge transfer path are defined as charge transfer stages, the horizontal charge transfer path 23 is built from a plurality of charge transfer stages (square blocks in FIG. 2) arranged in the horizontal direction. As shown in FIG. 2, when the charges are transferred from the vertical charge transfer paths 22 to the horizontal charge transfer path 23, transfer packets 25 for accumulating charges transferred from respective vertical charge transfer paths are formed in respective charge transfer stages corresponding to the "n" vertical charge transfer paths 22 among the plurality of charge transfer stages. Barriers 26 of the transfer packets 25 are formed in the charge transfer stages other than the charge transfer stages of the transfer packets 25. After the charges have migrated to the respective "n" transfer packets 25, the horizontal transfer electrodes are supplied with the H pulse, and the transfer packets 25 are sequentially transferred in the horizontal direction. As a result, the charges transferred from the vertical charge transfer paths 22 can be transferred to the FD amplifier 24.

In the present embodiment, positions of the respective "n" transfer packets 25 formed in the horizontal charge transfer path 23 in the state shown in FIG. 2 are assumed to be expressed as coordinates "i" (i=1, 2, 3, . . . n) with reference to the position of the transfer packet 25 located closest to the FD amplifier 24. Positions of the transfer packets 25 acquired in the state shown in FIG. 2 are hereinafter referred to as "initial positions."

Figure 3:
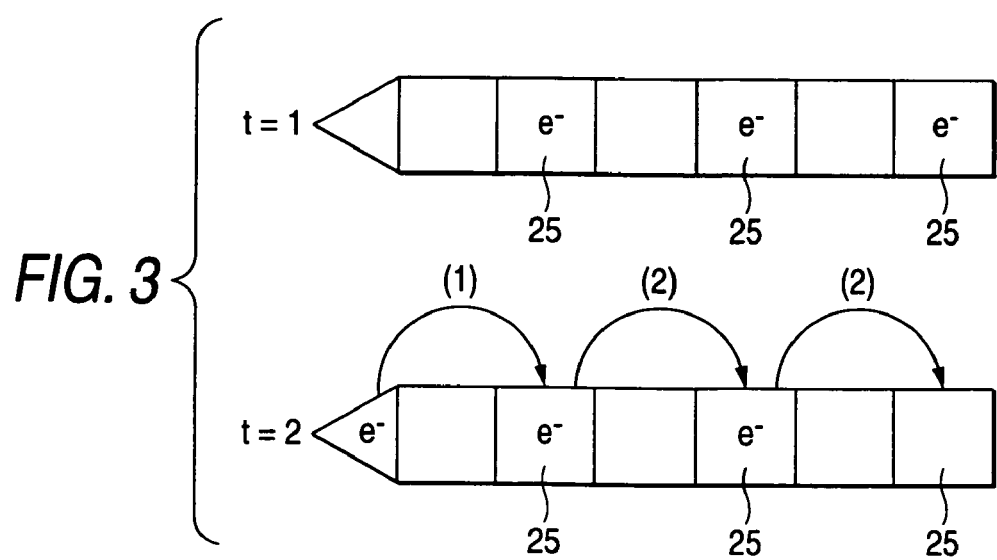
FIG. 3 is a view for describing transfer operation performed in the horizontal charge transfer path shown in FIG. 1.

FIG. 3 is a view showing a state where transfer packets 25 whose initial positions are a coordinate i=2 at time t=1 are transferred to a coordinate i=1 at time t=2.

The following two factors are responsible for deterioration of charge transfer occurred in the horizontal transfer path 23 having the configuration shown in FIG. 2.

An untransferred charge (1) which is lost when the charge in the transfer packet 25 moved to the final charge transfer stage of the horizontal charge transfer path 23 moves to an FD section of the FD amplifier 24 (see FIG. 3).

An untransferred charge (2) which is lost before the transfer packet 25 whose initial position has a coordinate "i" is transferred to the final charge transfer stage of the horizontal charge transfer path 23 (see FIG. 3).

Both the untransferred charges (1) and (2) are charges which are to be shifted, by means of transfer operation, from the transfer packet 25 whose initial position is the coordinate "i" to a transfer packet 25 whose initial position is a coordinate i+1. Therefore, so long as the transfer packet 25 which is next to the transfer packet 25 of interest in the charge transfer direction is made empty and so long as drive for transfer is performed, the untransferred charge (1) or (2) left in the packet 25 of interest can be accumulated in the empty packet. In the present embodiment, correction data for making a correction to signal deterioration responsible for transfer deterioration occurred in the horizontal charge transfer path 23 are acquired by utilization of the phenomenon, thereby enabling correction of signal deterioration.

The digital camera 1 of the present embodiment can set a correction data generation mode in which data for making a correction to signal deterioration responsible for faulty transfer of a charge through the horizontal charge transfer path 23 are generated, and a photographing mode in which imaging operation is performed in response to a command from the user. The correction data generation mode may be a mode which can be set only before shipment of the digital camera 1.

In the correction data generation mode, the OFD pulse supply section 6, the V driver 7, and the H driver 8 perform first drive operation for exposing the photoelectric conversion elements 21 under exposure conditions under control of the control section 11 and accumulating reference charges developed in the photoelectric conversion elements 21 as a result of exposure in a portion of the "n" transfer packets 25 (e.g., a transfer packet 25 at a coordinate i=2m−1 ("m" is a natural number of one or more)) formed in the horizontal charge transfer path 23. By means of the first drive operation, an empty pocket 25—where no reference charge is accumulated—is formed at a coordinate i=2, in correspondence to the transfer packet 25 located at a coordinate i=2m−1 (hereinafter called a "charge accumulation packet 25"), next to the coordinate i=2m−1 with reference to the charge transfer direction.

The first drive operation is performed in such a way that charge accumulation packets are located at odd coordinates and such that empty packets are present at even coordinates. However, the requirement is to satisfy conditions of: a portion of the "n" transfer packets 25 serving as a charge accumulation packet; one empty packet 25 corresponding to the charge accumulation packet 25; and the one empty packet 25 being formed upstream next to the charge accumulation packet 25 in the charge transfer direction. The first drive operation is not limited to the previous method.

Figure 4A:
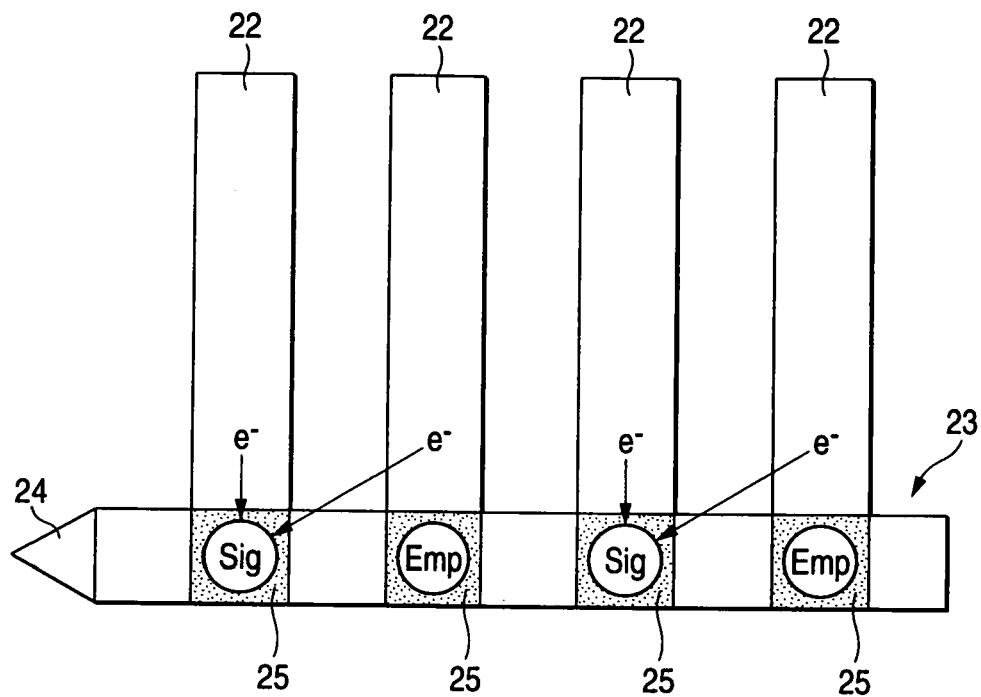
FIG. 4 is a view for describing operation of the horizontal charge transfer path shown in FIG. 1 performed in a correction data generation mode.
Figure 4B:
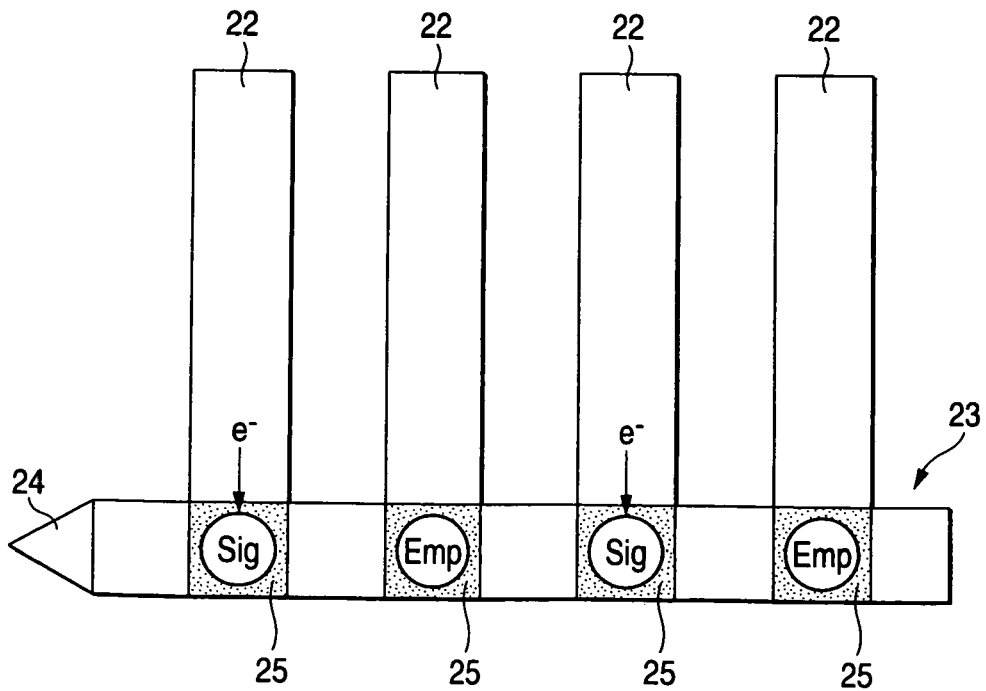

Conceivable various methods for alternately driving the charge accumulation packet 25 and the empty packet 25 in the horizontal direction include a method for adding two horizontally-adjacent charges among a plurality of charges shifted to the horizontal charge transfer path 23, such as that shown in FIG. 4A; a method for preventing shift of the charge to the horizontal charge transfer path 23 from the vertical charge transfer path 22 corresponding to the even transfer packet 25 at the coordinate "i"; and the like.

After formation of the charge accumulation packets 25 and the empty packets 25, the OFD pulse supply section 6, the V driver 7, and the H driver 8 perform, under control of the control section 11, second operation for horizontally transferring the charge accumulation packets 25 and the empty packets 25. By means of the second drive operation, the solid-state imaging devices 2 alternately outputs a reference signal (a reference signal level is constant regardless of the initial position of the charge accumulation packet 25) responsive to the reference charge still remaining in the charge accumulation packet 25 and an untransferred signal (a untransferred signal level changes according to the initial position of the charge accumulation packet 25) responsive to the untransferred charge left in the empty packet 25 corresponding to the charge accumulation packet 25, and the thus-output signals are temporarily stored in the memory 4.

The OFD pulse supply section 6, the V driver 7, and the H driver 8 perform the first and second drive operations under each of the exposure conditions by means of changing the exposure conditions in a plurality of patterns.

When an imaging command is input by way of the operation section 12 in the photographing mode, the OFD pulse supply section 6, the V driver 7, and the H driver 8 perform imaging drive operation which includes: exposing the photoelectric conversion elements 21 on set exposure conditions under control of the control section 11; accumulating, in the respective "n" transfer packets 25 formed in the horizontal charge transfer path 23, imaging charges occurred in the respective photoelectric conversion elements 21 by means of exposure; and horizontally transferring the transfer packets 25. By means of the imaging drive operation, the solid-state imaging device 2 outputs imaging signals (the signals are not always of the same level) conforming to the imaging charges remaining the respective transfer packets 25, and the signals are temporarily stored in memory 4.

Turning back to FIG. 1, the signal processing section 14 includes a storage control unit 141; memory 142 formed from a storage medium, such as RAM and ROM; a data interpolation unit 143; a correction function generation unit 144; an untransferred level generation unit 145; and a signal deterioration correction unit 146.

The storage control unit 141 stores, in the memory 142, the amount of reference signal (a reference signal level) acquired from the charge accumulation packet 25—whose initial position is coordinate i=2m−1 and which is output from the solid-state imaging device 2 by means of the first and second drive operations and temporarily stored in the memory 4—in association with the amount of untransferred signal (an untransferred signal level) acquired from the empty packet 25 whose initial position is i=2m and with the coordinate i=2m−1. For instance, when the first and second operations are performed on the four exposure conditions R1 to R4 with n=7, the coordinate "i" of the initial position, the reference signal level, and the untransferred signal level are stored, in an associated manner, in the memory 142 for each of the exposure conditions, as shown in FIG. 5.

In accordance with the data shown in FIG. 5, the data interpolation unit 143 subjects the data shown in FIG. 5 to processing for interpolating untransferred signal levels corresponding to coordinates other than the coordinate of the initial position that has already been stored. The untransferred signal levels acquired under the same exposure conditions are proportional to the value of the coordinate "i" of the initial position. Therefore, an untransferred signal level corresponding to the initial position having a coordinate i=2m can be readily acquired from the data shown in FIG. 5 through linear interpolation.

FIG. 6 is a view showing table acquired after interpolation of the data of the table shown in FIG. 5. Hatched data in FIG. 6 have been interpolated by the data interpolation unit 143. As mentioned previously, the untransferred signal level acquired under the same exposure conditions is proportional to the value of the coordinate "i" of the initial position. Therefore, so long as two coordinates of the initial position and untransferred signal levels corresponding to the respective two coordinates are stored in the memory 142 in connection with one reference signal level, the table shown in FIG. 6 formed by interpolation of untransferred signal levels corresponding to coordinates of all initial positions can be created.

Figure 7:
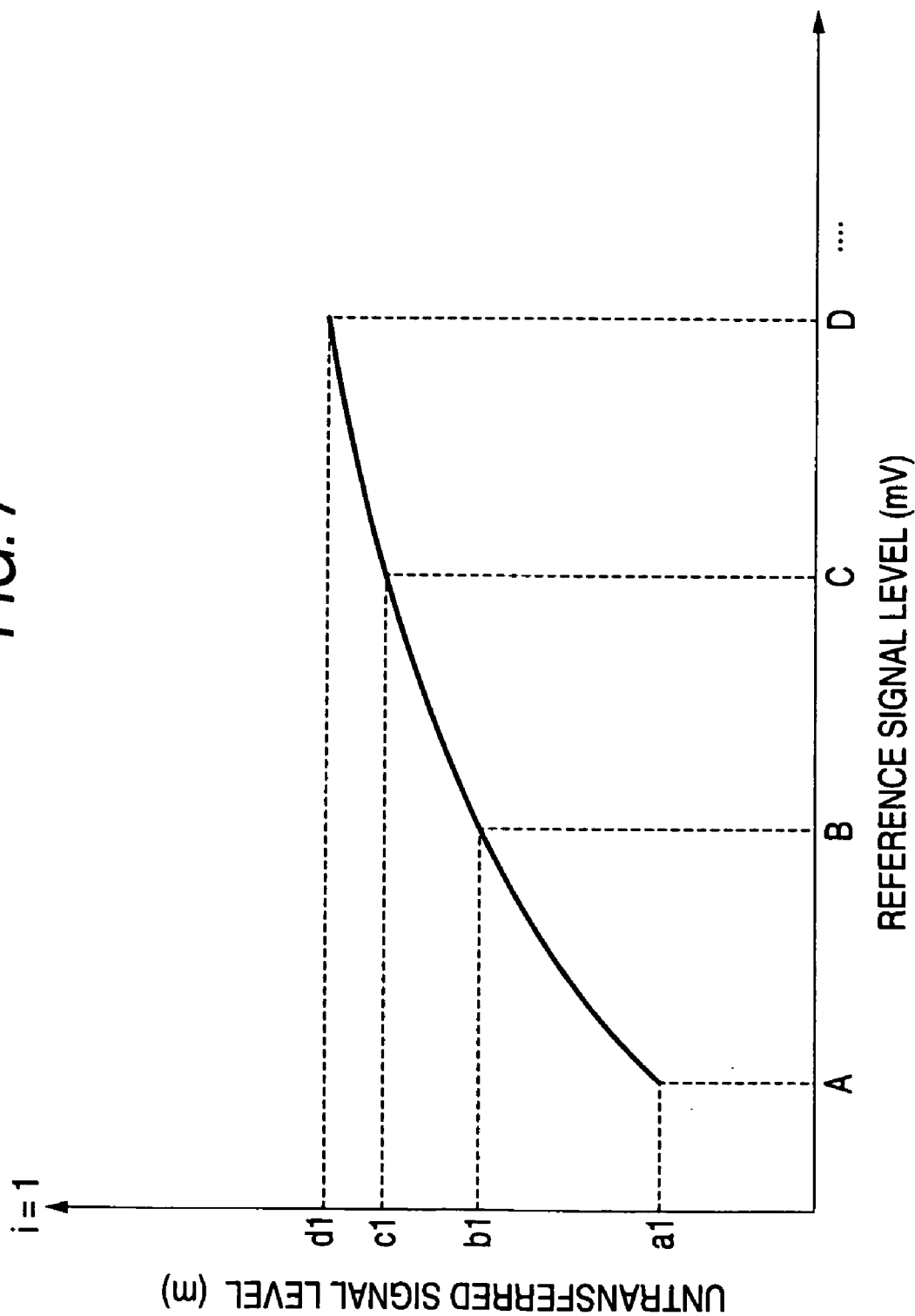
FIG. 7 is a view showing a graph of a correction function generated from the table shown in FIG. 6.

By means of the table shown in FIG. 6, a graph, such as that shown in FIG. 7, showing a relationship between a reference signal level and a corresponding untransferred signal level can be plotted in each of the coordinates. FIG. 7 shows a graph acquired at a coordinate i=1 generated from the data shown in FIG. 6. In FIG. 7, an untransferred signal level corresponding to a reference signal level not provided in the table shown in FIG. 6 can be acquired through linear interpolation. The correction function generation unit 144 generates a correction function which expresses the graph shown in FIG. 7 while taking the reference signal level as a variable, for each of the coordinates, and the thus-generated function is stored in the memory 142.

The untransferred level generation unit 145 acquires, from the memory 4, the imaging signal S(i) which is stored in the memory 4 in accordance with the imaging command acquired in the photographing mode and which conforms to the imaging charge accumulated in the transfer packet 25 whose initial position is the coordinate "i." The untransferred level generation unit generates an untransferred signal Y(i)—which is an untransferred signal corresponding to the imaging signal S(i)—by means of the correction function generated in connection with the coordinates "I" of the initial position of the imaging signal S(i) stored in the memory 142 and from the coordinate of the initial position of and the amount (a signal level) of the imaging signal S(i). The untransferred signal Y(i) is equivalent to the signal level lost from the imaging signal S(i) by a charge transfer failure occurred in the horizontal charge transfer path 23.

The signal deterioration correction unit 146 corrects signal deterioration of the imaging signals S(i) in accordance with an untransferred signal Y(i) generated by the untransferred level generation unit 145, by means of the following correction equation (a).

$$O(i)=S(i)+Y(i)-Y(i-1)+Z(i), \text{ where } Y(0)=0 \quad (a)$$

O(i): a corrected imaging signal;

Z(i): a signal level lost by the reset section of the FD amplifier 24 (an experimentally-known value).

Signals lost from the imaging signal S(i) by the untransferred charges (1) and (2) can be restored by means of computation represented by "S(i)+Y(i)" of the correction equation (a). However, computing operation represented by only that portion of the equation results in the imaging signals S(i) acquired from the coordinate i=2 and subsequent coordinates being additionally provided with the untransferred signal Y(i−1), and the additions cannot be corrected. For this reason, computing operation represented by "−Y(i−1)" is performed to eliminate an additional signal added to the imaging signal S(i). In this way, the signal deterioration correction unit 146 performs computing operation of the correction equation (a), thereby making a correction to signal deterioration responsible for the untransferred charges (1) and (2) of the imaging signal S(i).

Operation of the digital camera configured as mentioned above will be described.

When the digital camera 1 is set to a correction data generation mode, the first drive operation and the second drive operation are performed, and the solid-state imaging device 2 outputs the reference signal and the untransferred signal. The thus-output signals are temporarily stored in the memory 4. Next, the table, such as that shown in FIG. 5, is compiled from the reference signal and the untransferred signal stored in the memory 4, and the thus-made table is stored in the memory 142. Data pertaining to the thus-made table are interpolated, whereby the table in the memory 142 are updated as shown in FIG. 6. A correction function is generated from the table shown in FIG. 6, and the thus-generated function is stored in the memory 142, whereupon the correction data generation mode is completed. The digital camera 1 is shipped in this state.

When the user who has acquired the thus-shipped digital camera 1 sets the digital camera 1 to a photographing mode, the solid-state imaging device 2 outputs an imaging signal S(i), and the thus-output signal is temporarily stored in the memory 4. An untransferred signal Y(i) corresponding to the imaging signal S(i) is generated from the imaging signal S(i) and the correction function stored in the memory 142. Next, computing operation of the correction equation (a) is performed, and signal deterioration of the imaging signal S(i) is corrected. A corrected imaging signal O(i) is stored in the memory 4. The signal processing section 14 subjects the imaging signal O(i) to predetermined digital signal processing, to thus generate image data. After being compressed by the compression-decompression processing section 13, the image data are recorded in the recording medium 16.

As mentioned above, the digital camera 1 stores in the memory 142, for each of the plurality of exposure conditions, in an associated manner the reference signal and the untransferred signal, which have been output from the solid-state imaging device 2 as a result of performance of the first drive operation and the second drive operation, and the coordinate. An untransferred signal corresponding to the imaging signal S(i) is generated in accordance with the data stored in the memory 142. Therefore, transfer efficiency of the transfer packet 25 achieved in an actually-used state at each position can be obtained, and signal deterioration of the imaging signal S(i) can be corrected with high accuracy.

Since the signal corresponding to the untransferred charge (1) is uniformly included in each of the untransferred signals Y(1) to Y(n), the signals lost from the imaging signal S(i) by the untransferred charges (1) can be restored to their original state by means of computing operation represented by "S(i)+Y(i)" of the correction equation (a). Specifically, when correction of signal deterioration responsible for the untransferred charge (1) is taken as the only objective, the required number of untransferred signal level to be stored in the table shown in FIG. 5 is only one. For instance, the essential requirement is to store only the correction function showing a graph, such as that shown in FIG. 7, in the memory 142. The essential requirement for the signal deterioration correction unit 146 is to perform computing operation represented by "S(i)+Y(i)," thereby correcting signal deterioration responsible for the untransferred charge (1), and to correct signal deterioration responsible to the untransferred charge (2) by means of a known method.

A plurality of empty packets 25 may also be present between the charge accumulation packets 25 formed by the first drive operation. Even when the plurality of empty packets 25 are present, an untransferred charge is accumulated in only the empty packet 25 next to the charge accumulation packet 25. An untransferred signal acquired from this empty packet 25 is stored in the memory 142, and signals acquired from the other empty packets 25 are disregarded without being stored.

In the above descriptions, the data interpolation unit 143 and the correction function generation unit 144 are operated in the correction data generation mode. However, these sections may also be activated for each photographing operation in the photographing mode.

Further, in the above descriptions, the digital camera 1 incorporates the storage control unit 141, the data interpolation unit 143, and the correction function generation unit 144. Processing operations performed by these sections may also be performed by an external computer, and data acquired through the processing operations may also be stored in the memory 142. Specifically, the storage control unit 141, the data interpolation unit 143, and the correction function generation unit 144 may also not be provided in the digital camera 1.

Transfer of a charge through the horizontal charge transfer path 23 is induced by a phenomenon called thermal diffusion drift. The phenomenon is dependent on the temperature. An equation (b) provided below is called the Einstein relation and expresses a relationship between the mobility of an electron and a diffusion constant.

$$D_n = \left(\frac{kT}{q}\right)\mu_n \quad (b)$$

where Dn is a diffusion coefficient, μn: mobility, k: Boltzmann constant, T is a temperature, and "q" is the amount of charges.

According to the expression, the diffusion coefficient is proportional to the temperature. Hence, the transfer efficiency increases with an increase in temperature and decreases along with a decrease in temperature. Accordingly, when the correction function is used as is, the function will be affected by temperature dependence, which may result in erroneous correction. In the present embodiment, it is desirable that the storage control unit 141 will acquire information about the temperature of the solid-state imaging device 2 acquired during exposure in the correction data generation mode and will store the reference signal read from the memory 4 in association with the information about the temperature; and that the untransferred signal generation unit 145 will generate an untransferred signal Y(i) by use of information about the temperature of the solid-state imaging device 2 acquired during exposure in the photographing mode, as well.

For instance, provided that a temperature corresponding to the table shown in FIG. 6 is taken as T1 and that a temperature achieved during exposure in the photographing mode is taken as T2, the essential requirement for the untransferred signal generation unit 145 is to perform processing for taking, as a final untransferred signal Y(i), a value determined by multiplying the generated untransferred signal Y(i) by a coefficient $a=a0\times(T2/T1)$ (a0 is an experimentally-determined initial value). The temperature dependence of transfer efficiency can be compensated for by means of processing. Alternatively, it may also be better to generate a correction function for each of the plurality of temperatures in the correction data generation mode and generate an untransferred signal Y(i) from the correction function corresponding to a temperature closest to the temperature achieved in the photographing mode.

When a charge cannot be transferred during a period of time over which a voltage is applied to the horizontal transfer electrode, a transfer failure arises in the horizontal charge transfer path 23. Specifically, the higher the drive frequency of the horizontal charge transfer path 23, the shorter the time required to transfer a charge, and the lower transfer efficiency. Conversely, the lower the drive frequency, the higher transfer efficiency. Accordingly, in the present embodiment, it is desirable that the storage control unit 141 will acquire information about a drive frequency of the horizontal charge transfer path 23 of the solid-state imaging device 2 during exposure in the correction data generation mode and will store the reference signal read from the memory 4 in association with the information about the drive frequency; and that the untransferred signal generation unit 145 will generate an untransferred signal Y(i) by use of information about the drive frequency of the horizontal charge transfer path 23 of the solid-state imaging device 2 during exposure in the photographing mode, as well.

For instance, provided that the drive frequency corresponding to the table shown in FIG. 6 is taken as f1 and that the drive frequency acquired in the photographing mode is taken as f2, the essential requirement for the untransferred signal generation unit 145 is to perform processing taking, as a final untransferred signal Y(i), a value determined by multiplying the generated untransferred signal Y(i) by a coefficient $b=b0\times(f2/f1)$ (b0 is an experimentally-determined initial value). The drive frequency dependence of transfer efficiency can be compensated for by means of processing. Alternatively, it may also be better to generate a correction function for each of the plurality of temperatures in the correction data generation mode and generate an untransferred signal Y(i) from the correction function corresponding to a temperature closest to the temperature achieved in the photographing mode.

Second Embodiment

Figure 8:
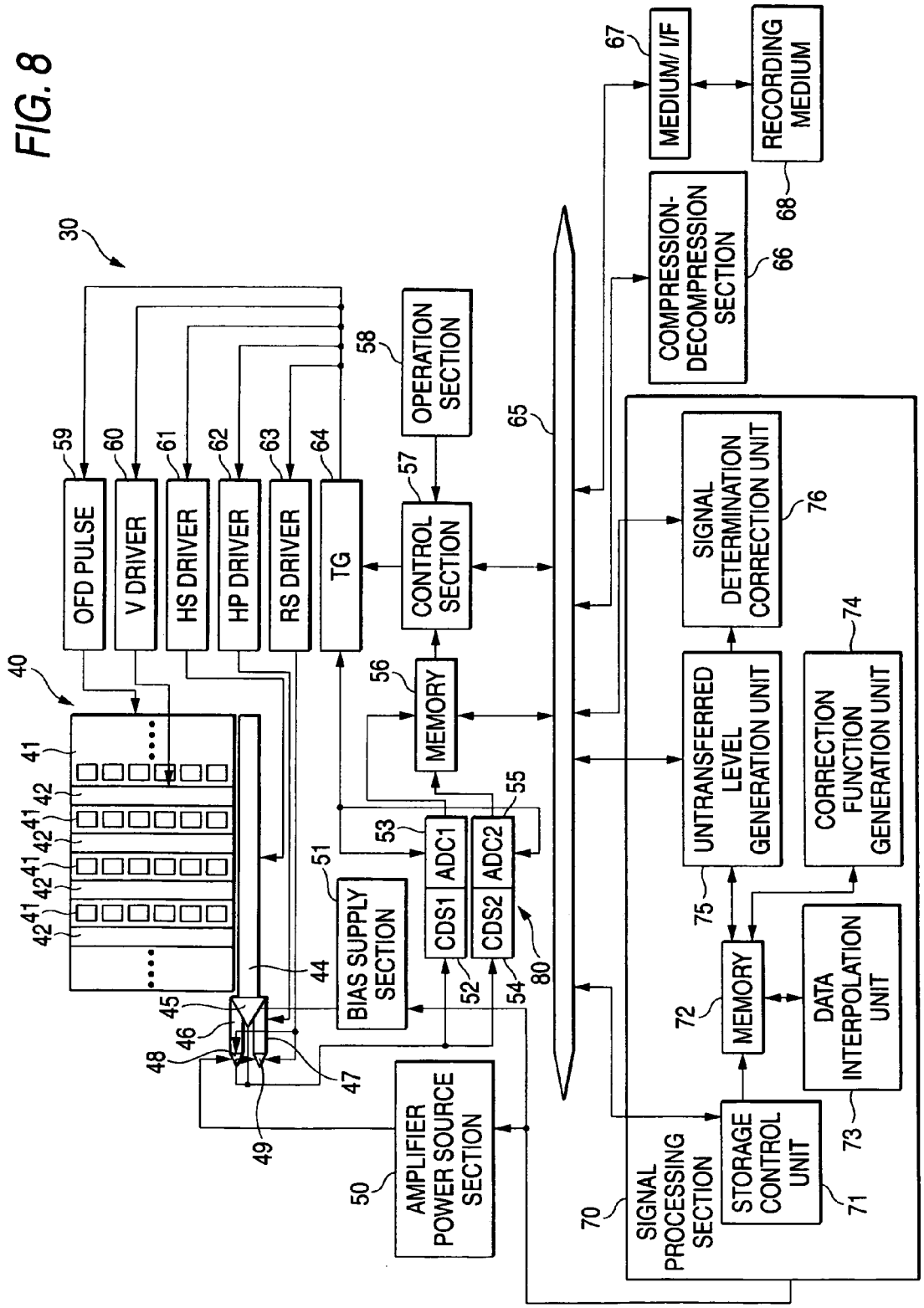
FIG. 8 shows a configuration of a digital camera which is a second exemplary embodiment of the imaging apparatus of the present invention.

FIG. 8 is a view showing the general configuration of a digital camera which is a second exemplary embodiment of an imaging apparatus of the present invention.

A digital camera 30 shown in FIG. 8 has a solid-state imaging device 40; an analogue front end (AFE) 80 which subjects an analogue imaging signal output from the solid-state imaging device 40 to analogue signal processing and which subsequently converts the analogue signal into a digital signal; and memory 56, such as RAM, for temporarily storing the digital signal converted by the AFE 80.

Figure 9:
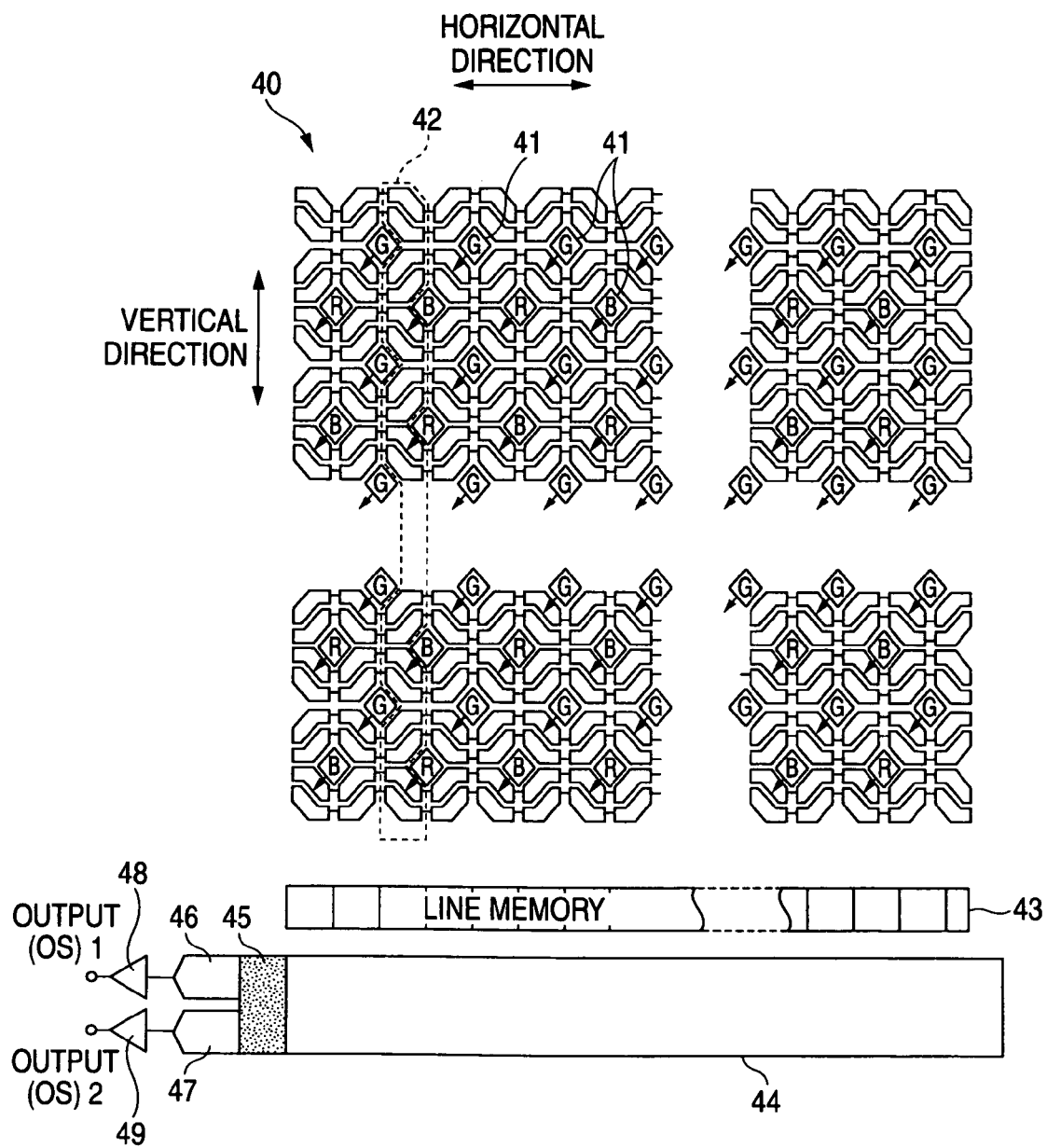
FIG. 9 is a planar schematic view of a solid-state imaging device of the digital camera shown in FIG. 8.

FIG. 9 is an enlarged view of the solid-state imaging device 40.

The solid-state imaging device 40 has a plurality of photoelectric conversion elements 41 arranged on a surface of a semiconductor substrate; "n" ("n" is a natural number of two or more) vertical charge transfer paths 42 for vertically transferring charges developed in the respective photoelectric conversion elements 41; and a horizontal charge transfer path 44 for transferring the charges transferred through the "n" vertical charge transfer paths 42 in a horizontal direction orthogonal to the vertical direction. Each of the photoelectric conversion elements 41 includes an R photoelectric conversion element (designated by R in the drawing) for detecting light of a red wave range, a G photoelectric conversion element (designated by G in the drawing) for detecting light of a green wave range, and a B photoelectric conversion element (designated by B in the drawing) for detecting light of a blue wave range. These elements are arranged according to a Bayer arrangement known as a layout for color filters.

The vertical charge transfer paths 42 are formed from a buried channel, and a plurality of unillustrated vertical transfer electrodes are formed on the vertical charge transfer paths 42 while being arranged in a vertical direction. Operation for transferring charges through the vertical charge transfer paths 42 is controlled as a result of the vertical transfer electrodes being supplied with a vertical drive pulse (V pulse). The horizontal charge transfer path 44 is formed from a buried channel, and a plurality of unillustrated horizontal transfer electrodes are formed on the horizontal charge transfer path while being arranged in the horizontal direction. Operation for transferring the charges through the horizontal charge transfer path 44 is controlled as a result of the horizontal transfer electrodes being supplied with a four-phase horizontal drive pulse (HS pulse).

Line memory 43 laid along the horizontal charge transfer path 44 is formed in a boundary area between ends of the respective vertical charge transfer paths 42 and the horizontal charge transfer path 44. As described in; for example, JP-A-2002-112119, the line memory 43 is used for temporarily accumulating charges received from the respective vertical charge transfer paths 42 and controlling timing at which the charges are output to the horizontal charge transfer path 44, thereby adding the charges in the horizontal direction, and the like.

An output end of the horizontal charge transfer path 44 is bifurcated into a first branch transfer path 46 and a second branch transfer path 47 by means of a charge branch path 45. The first branch transfer path 46 and the second branch transfer path 47 each are formed from a buried channel, and a plurality of unillustrated horizontal transfer electrodes are formed on the respective branch transfer paths while being arranged in the horizontal direction. Charge transfer operation is controlled as a result of the horizontal transfer electrodes being supplied with a two-phase horizontal drive pulse (HP pulse). A drive frequency of the horizontal charge transfer path 44 is double the drive frequency of each of the first and second branch transfer paths 46 and 47.

A first FD amplifier 48 serving as a first output section for outputting a signal responsive to the charge transferred through the first branch transfer path 46 is connected to the first branch transfer path 46. A second FD amplifier 49 serving as a second output section for outputting a signal responsive to the charge transferred through the second branch transfer path 47 is connected to the second branch transfer path 47.

A branch electrode is formed above the charge branch path 45, and a bias voltage from a bias supply section 51 is applied to the branch electrode.

Turning back to FIG. 8, the AFE 80 has a CDS circuit 52 for subjecting an analogue signal output from the first FD amplifier 48 to correlated double sampling and an ADC 53 for converting a signal output from the CDS circuit 52 into a digital signal. A digital signal output from the ADC 53 is temporarily stored in memory 56. Moreover, the AFE 80 has a CDS circuit 54 for subjecting an analogue signal output from the second FD amplifier 49 to correlated double sampling and an ADC 55 for converting a signal output from the CDS circuit 54 into a digital signal. A digital signal output from the ADC 55 is temporarily stored in the memory 56.

The digital camera 30 has a control section 57 for controlling the entirety of the digital camera 30 in a centralized manner; an OFD pulse supply section 59 for supplying an overflow drain pulse (OFD) to the solid-state imaging device 40; a V driver 60 for supplying the V pulse to the vertical transfer electrodes; an HS driver 61 for supplying the HS pulse to the horizontal transfer electrodes provided above the horizontal charge transfer path 44; an HP driver 62 for supplying the HP pulse to the horizontal transfer electrodes provided respectively above the first branch transfer path 46 and the second branch transfer path 47; an RS driver 63 for controlling resetting operation of FD amplifiers 48 and 49; an amplifier power source section 50 serving as a power source for the FD amplifiers 48 and 49; a timing generator (TG) 64 which generates a timing signal for determining activation timing of the AFE 80, the OFD pulse supply section 59, the V driver 60, the HS driver 61, the HP driver 62, and the RS driver 63; an operation section 58 connected to a control section 57 for setting various operation modes of the digital camera 30; a signal processing section 70 which subjects the imaging signal stored in the memory 56 to digital signal processing; a compression-decompression processing section 66; a medium IF 67; and a recording medium 68 connected to the medium IF 67. The signal processing section 70, the compression-decompression processing section 66, the medium IF 67, the memory 56, the control section 57 are connected to a bus 65, respectively.

Figure 10:
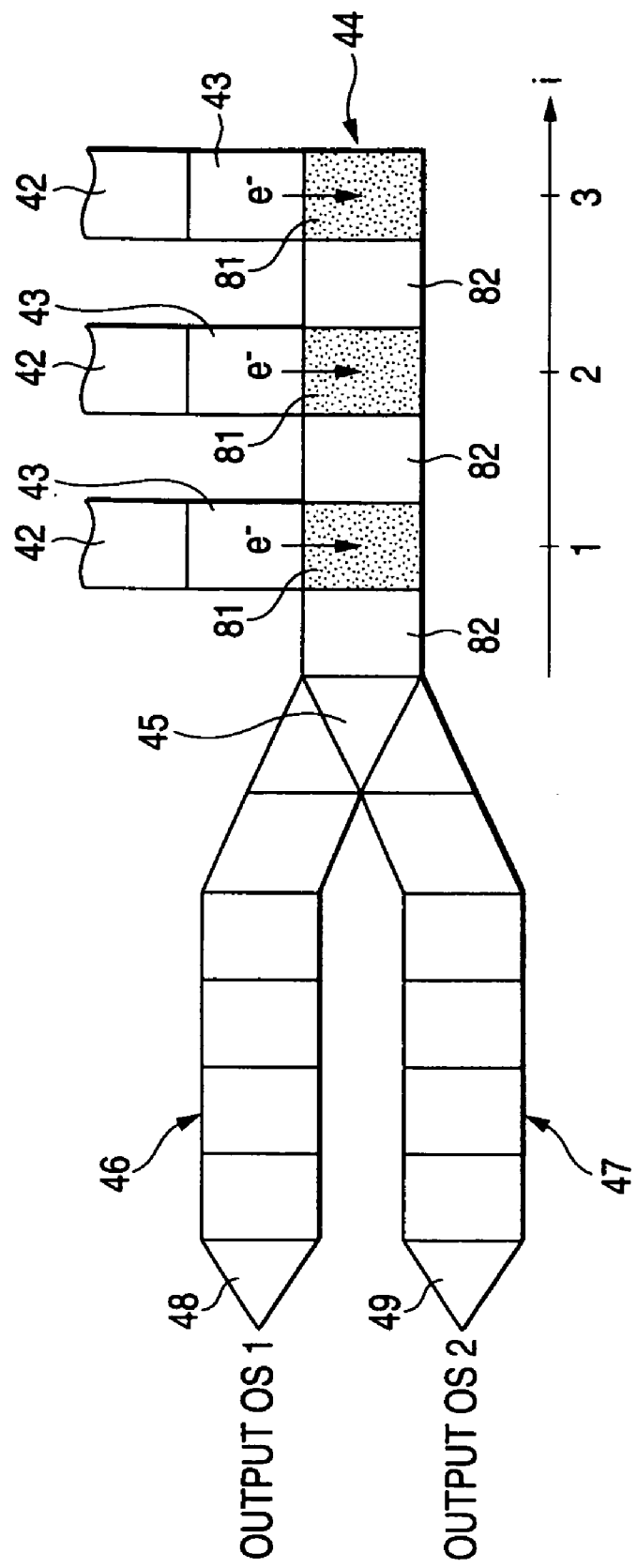
FIG. 10 is a partially-enlarged view of a periphery of the horizontal charge transfer path shown in FIG. 9.

FIG. 10 is an enlarged view of the periphery of the horizontal charge transfer path 44 of the solid-state imaging device 40 shown in FIG. 9. FIG. 10 shows a state where charges are transferred from the "n" vertical charge transfer paths 42 to the horizontal charge transfer path 44.

Provided that portions of the first branch transfer path 46, portions of the second branch transfer path 47, and portions of the horizontal charge transfer path 44 overlapping the horizontal transfer electrodes located above them are defined as charge transfer stages, the first branch transfer path 46, the second branch transfer path 47, and the horizontal charge transfer path 44 are built from a plurality of charge transfer stages (square or triangular blocks in the drawing) arranged in the horizontal direction. As shown in FIG. 10, the number of charge transfer stages of the first branch transfer path 46 is smaller than the number of charge transfer stages of the second branch transfer path 47 by one. The reason for this is that, when the first branch transfer path 46 and the second branch transfer path 47 are driven by a single HP pulse and when the charge transferred up to the final stage through the first branch transfer path 46 is converted into a voltage signal by means of the first FD amplifier 48, the charge transferred up to the final stage through the second branch transfer path 47 can be concurrently converted into a voltage signal by means of the second FD amplifier 49.

A solid-state imaging device configured in such a way that an output end of the horizontal charge transfer path is bifurcated into two branch transfer paths and that the charges transferred through the horizontal charge transfer path are transferred through the two branch transfer paths while being divided between the paths is known as described in Patent Publication Nos. 2585604, No. 2949861, and the like.

As shown in FIG. 10, when the charges are transferred from the vertical charge transfer paths 42 to the horizontal charge transfer path 44, transfer packets 81 for accumulating charges transferred from respective vertical charge transfer paths are formed in respective charge transfer stages corresponding to the "n" vertical charge transfer paths 42 among the plurality of charge transfer stages of the horizontal charge transfer path 44. Barriers 82 of the transfer packets 81 are formed in the charge transfer stages other than the charge transfer stages.

After the charges have migrated to the respective "n" transfer packets 81 from the line memory 43, the horizontal transfer electrodes are supplied with the HS pulse and the HP pulse, whereby the transfer packets 81 are sequentially transferred in the horizontal direction. The charge branch path 45 transfers the transfer packets 81 transferred through the horizontal charge transfer path 44 by alternately dividing the packets between the first branch transfer path 46 and the second branch transfer path 47. As a result, one-half of signals corresponding to the charges transferred from the respective vertical charge transfer paths 42 can be output from the FD amplifier 48, and a remaining of the signals can be output from the FD amplifier 49.

In the present embodiment, positions of the respective "n" transfer packets 81 formed in the horizontal charge transfer path 44 in the state shown in FIG. 10 are assumed to be expressed as coordinates "i" (i=1, 2, 3, . . . n) with reference to the position of the transfer packet 81 located closest to the FD amplifiers 48 and 49. Moreover, positions of the transfer packets 81 acquired in the state shown in FIG. 10 are hereinafter referred to as "initial positions."

Figure 11:
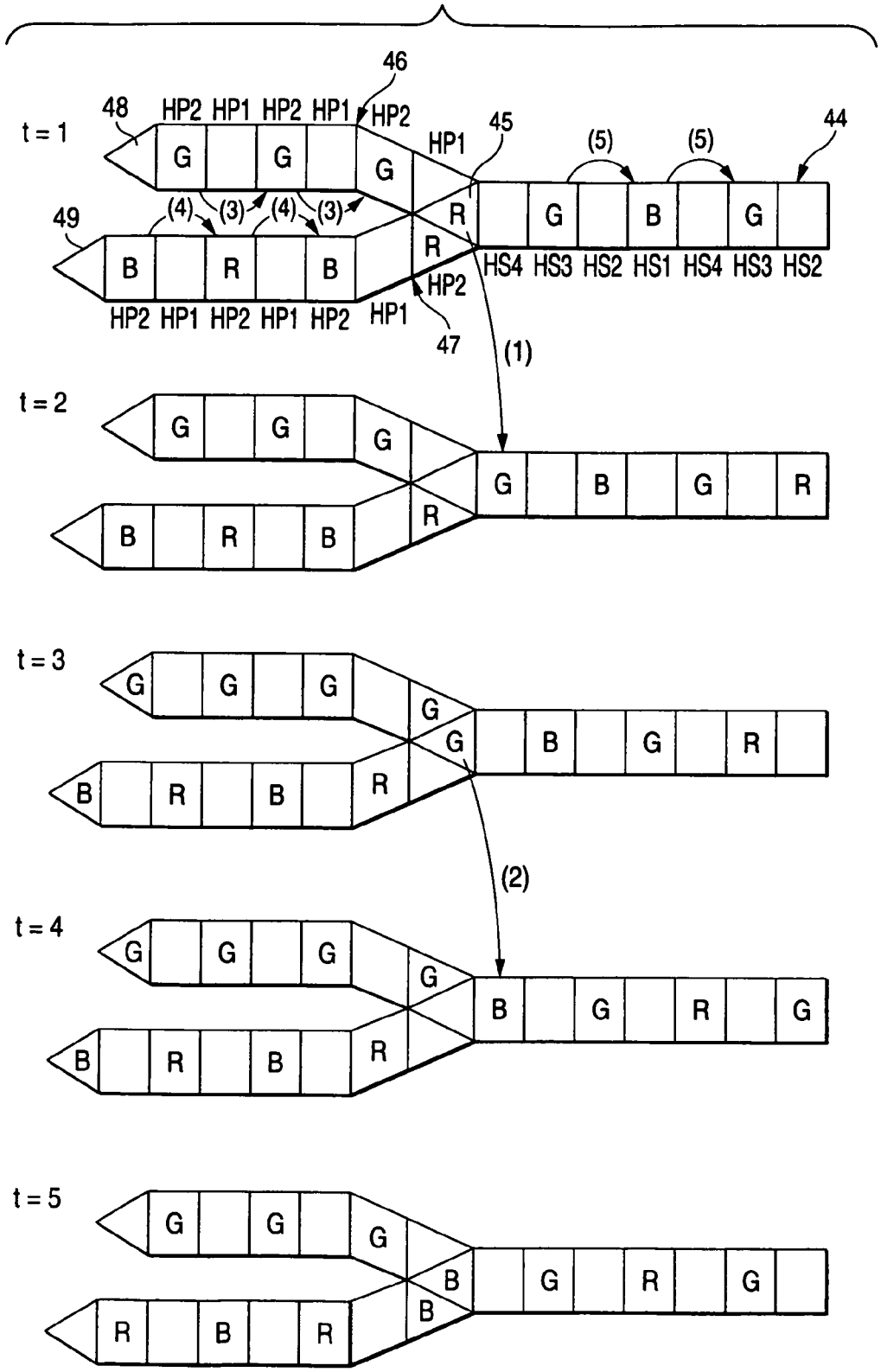
FIG. 11 is a view for describing transfer operation of the horizontal charge transfer path shown in FIG. 9 performed in a photographing mode.

FIG. 11 is a view for describing operation for transferring the transfer packets 81. Designations of the horizontal transfer electrodes located above the respective charge transfer stages are provided above or below the respective charge transfer stages shown in FIG. 11. Reference symbols "R," "G," and "B" provided in the charge transfer stages denote an R charge acquired from the R photoelectric conversion element 41 for detecting red light, a C charge acquired from the G photoelectric conversion element 41, and a B charge acquired from the B photoelectric conversion element 41, respectively.

Figure 12A:
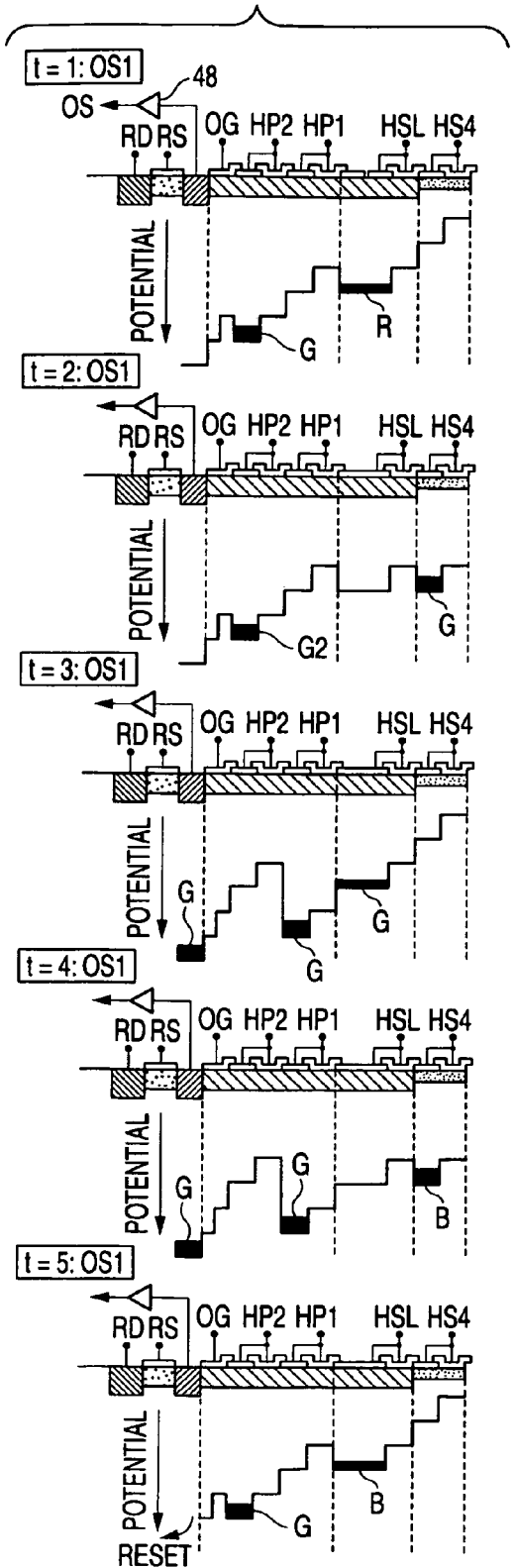
FIG. 12 is a view for describing transfer operation of the horizontal charge transfer path shown in FIG. 9 performed in a photographing mode.
Figure 12B:
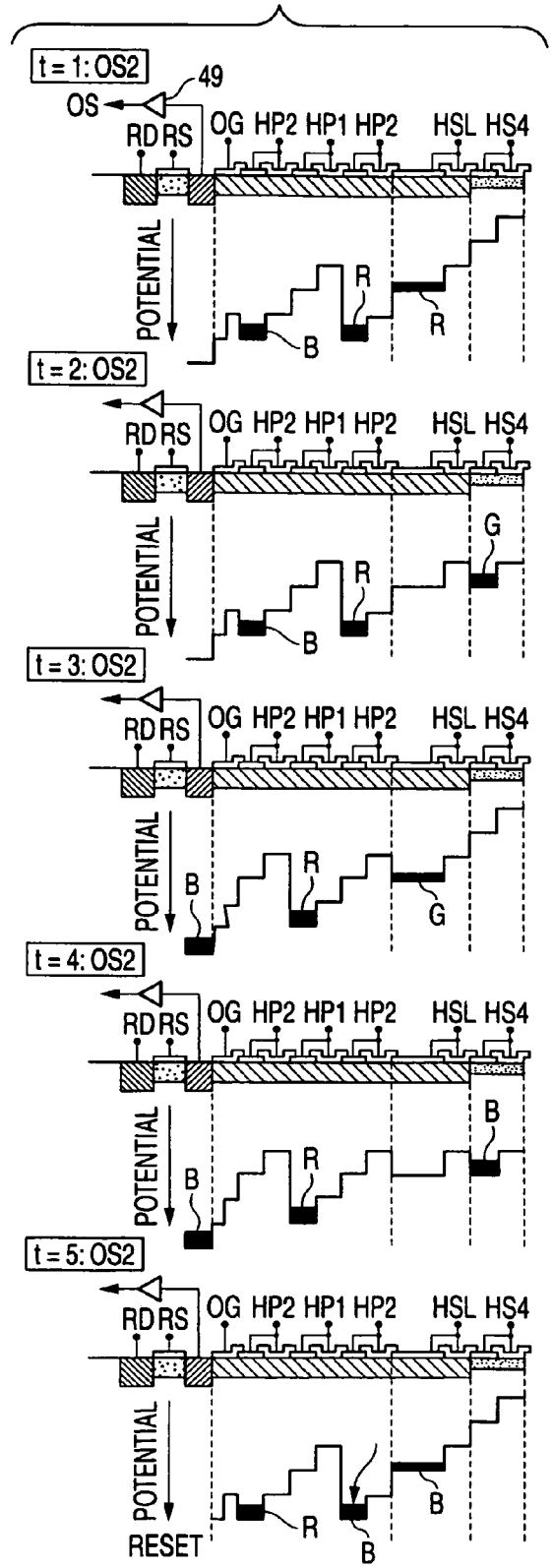

FIG. 12A is a view showing a cross section of a portion of a substrate from the horizontal electrode transfer path 44 to the first FD amplifier 48 achieved at respective times in FIG. 11 and electric potentials in the substrate achieved at the respective times. FIG. 12B is a view showing a cross section of a portion of a substrate from the horizontal electrode transfer path 44 to the second FD amplifier 40 achieved at respective times in FIG. 11 and electric potentials in the substrate achieved at the respective times. The cross section of the first branch transfer path 46 and the cross section of the second branch transfer path 47 are shown in FIG. 12 in a partially-omitted manner.

Figure 13:
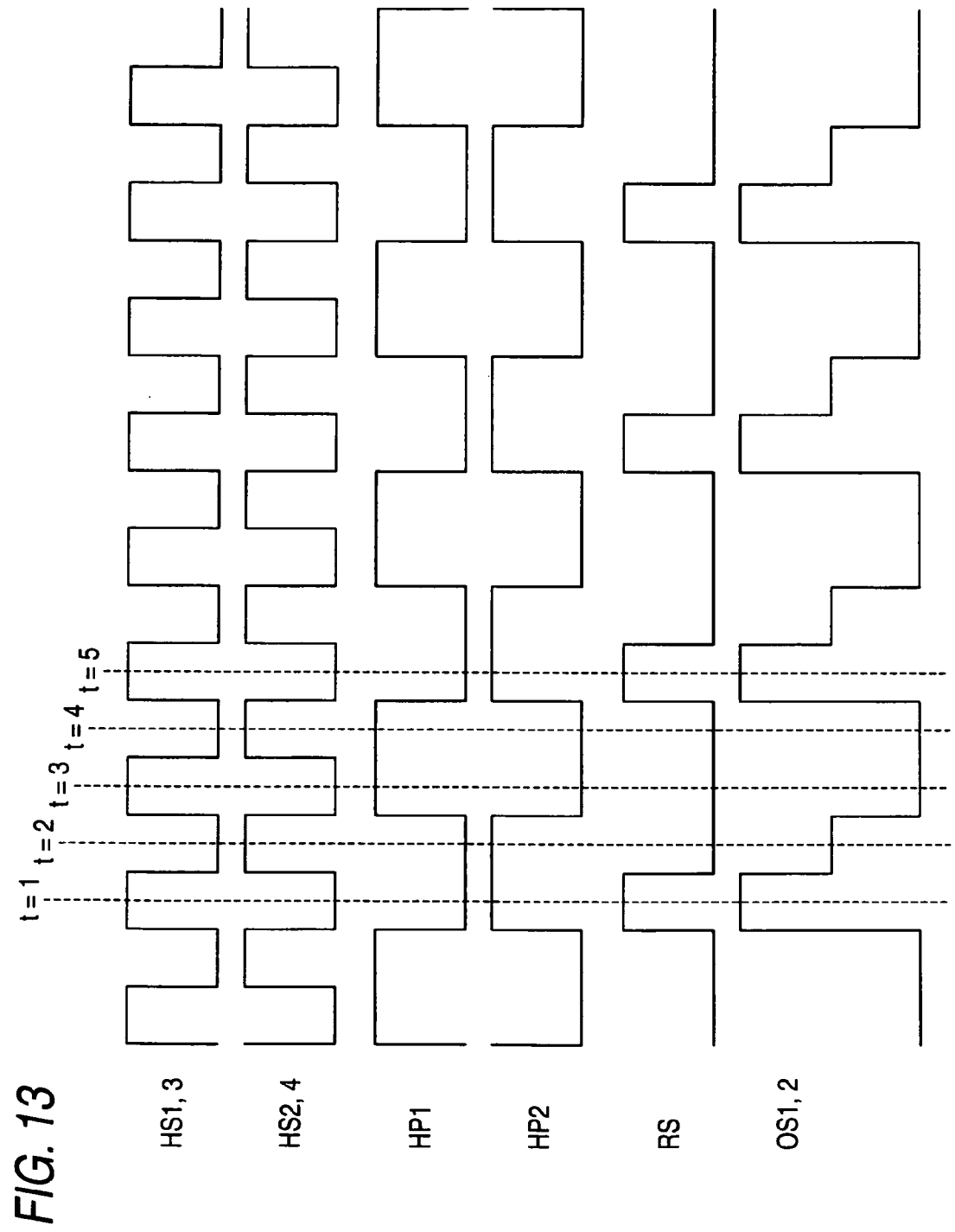
FIG. 13 is a view for describing transfer operation of the horizontal charge transfer path shown in FIG. 9 performed in a photographing mode.

FIG. 13 is a timing chart of the solid-state imaging device 40 achieved when the element is activated. In FIG. 13, reference symbols "HS1" to "HS4," "HS1," and "HP2" denote pulse waveforms applied to the horizontal transfer electrodes HS1 to HS4, HP1, and HP2 shown in FIGS. 11 and 12 at respective times shown therein. Reference symbol "RS" denotes a pulse waveform applied to reset gates of the FD amplifiers 48 and 49 shown in FIG. 12 at respective times. Reference symbols "OS1 and OS2" denote signal waveforms output from the first branch transfer path 46 and the second branch transfer path 47 at respective times.

Descriptions will be hereunder provided on the assumption that two states; namely, a state where charges are accumulated in sequence of BGRGBGRG . . . from a location close to the charge branch path 45 and a state where charges are accumulated in sequence of RGBGRGBG . . . from the location close to the charge branch path 45, are alternately taken.

When the transfer packet 81 accumulating the R charge is transferred to the charge branch path 45 at time t=1 in FIG. 11, the R charge passes through the charge branch path 45, to thus flow into the first charge transfer stage of the second branch transfer path 47, whereupon the transfer packet 81 is transferred to the second branch transfer path 47.

Next, the transfer packet 81 located in the horizontal charge transfer path 44 is transferred by one stage at time t=2. The transfer packet 81 located in the first branch transfer path 46 and another transfer packet 81 located in the second branch transfer path 47 are transferred by one stage at time t=3. The transfer packet 81—which accumulates the G charge and which is located in the horizontal charge transfer path 44—is transferred to the charge ranch path 45. The G charge flows into the first charge transfer stage of the first branch transfer path 46, whereupon the transfer packet 81 is transferred to the first branch transfer path 46.

The transfer packet 81 located in the horizontal charge transfer path 44 is transferred by one stage at time t=4. The transfer packet 81 located in the first branch transfer path 46 and another transfer packet 81 located in the second branch transfer path 47 are transferred by one stage at time t=5. The transfer packet 81—which accumulates the B charge and which is located in the horizontal charge transfer path 44—is transferred to the charge ranch path 45. The B charge flows into the first charge transfer stage of the second branch transfer path 47, whereupon the transfer packet 81 is transferred to the second branch transfer path 47.

As mentioned above, in the solid-state imaging device 40, the transfer packets 81 having the initial positions whose coordinates "i" assume even numbers [=2m ("m") is a natural number of one or more)] are transferred to the first branch transfer path 46, and the transfer packets 81 having the initial positions whose coordinates "i" assume odd numbers (=2m−1) are transferred to the second branch transfer path 47.

The following five factors are responsible for deterioration of charge transfer occurred in the horizontal transfer path 44 having the configuration shown in FIG. 9.

An untransferred charge (1) which is lost when the transfer packet 81 whose initial position has a coordinate i=2m−1 moves to the second branch transfer path 47 (see FIG. 11).

An untransferred charge (2) which is lost when the transfer packet 81 whose initial position has a coordinate i=2m moves to the first branch transfer path 46 (see FIG. 11).

An untransferred charge (3) which is lost when the transfer packet 81 whose initial position has a coordinate i=2m is transferred to the first branch transfer path 46 (see FIG. 11).

An untransferred charge (4) which is lost when the transfer packet 81 whose initial position has a coordinate i=2m−1 is transferred to the second branch transfer path 47 (see FIG. 11).

An untransferred charge (5) which is lost when all of the transfer packets 81 are transferred up to the final stage of the horizontal charge transfer path 44 (see FIG. 11).

The digital camera 30 of the present embodiment has the function of correcting signal deterioration responsible for the untransferred charges (1) to (5).

The digital camera 30 can set a correction data generation mode in which data for making a correction to signal deterioration responsible for the factors (1) through (5) are generated, and a photographing mode in which imaging operation is performed in response to a command from the user. The correction data generation mode is a mode which can be set only before shipment of the digital camera 30.

In the correction data generation mode, the OFD pulse supply section 59, the V driver 60, the HS driver 61, the HP drier 62, and the RS driver 63 perform initial drive operation for exposing the photoelectric conversion elements 41 under exposure conditions under control of the control section 57 and accumulating reference charges developed in the photoelectric conversion elements 41 as a result of exposure in a portion of the "n" transfer packets 81 (e.g., a transfer packet 81 at a coordinate i=4m−3) formed in the horizontal charge transfer path 44. By means of the initial drive operation, there is achieved a state where an empty pocket 81—a transfer packet 81 where no reference charge is accumulated—is respectively formed, in correspondence to the transfer packet 81 at a coordinate i=4m−3 (hereinafter called a "charge accumulation packet 81"), at an upstream coordinate i=4m−2 and an upstream coordinate i=4m−1 with reference to the charge transfer direction.

The initial drive operation is performed in such a way that a charge accumulation packet is located at the coordinate i=4m−3 and such that empty packets are present at the other coordinates. However, the essential requirement for the initial drive operation is to satisfy conditions of: a portion of the "n" transfer packets 81 serving as a charge accumulation packet 81; two empty packets 81 corresponding to the charge accumulation packet 81; and the two empty packets 81 being formed upstream next to the charge accumulation packet 81 in the charge transfer direction. The initial drive operation is not limited to the previous method.

Figure 14:
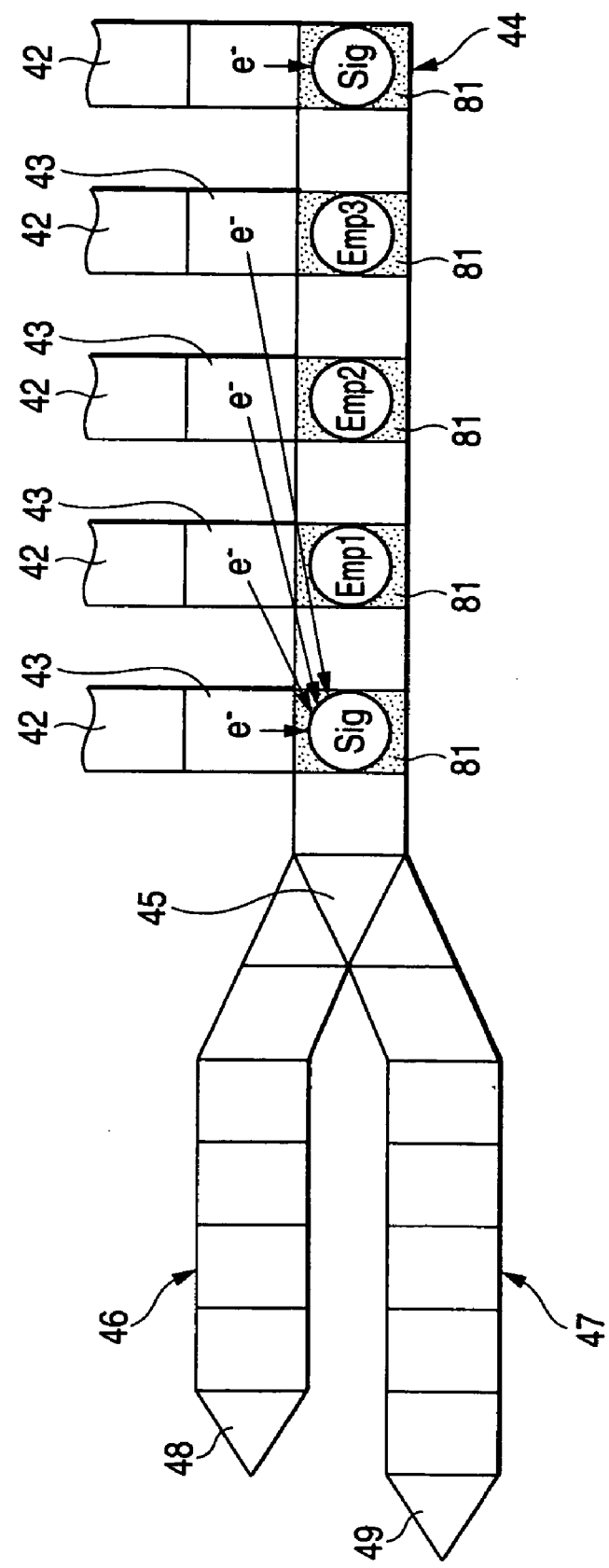
FIG. 14 is a view for describing operation of the horizontal charge transfer path shown in FIG. 9 performed in a correction data generation mode during initial drive operation.

FIG. 14 is a view showing a state achieved after performance of the initial drive operation.

As shown in FIG. 14, after initial drive operation, the charge accumulation packet 81 assigned "Sig" is formed at a coordinate i=1, and an empty packet 81 assigned "Emp1" is formed at a coordinate i=2. An empty packet 81 assigned "Emp2" is formed at a coordinate i=3. An empty packet 81 assigned "Emp3" is formed at a coordinate i=4. These four transfer packets 81 are present while being arranged side by side in the horizontal direction.

A specific method for performing initial drive operation includes a method for transferring charges accumulated respectively at; for example, a coordinate i=4m−2, a coordinate i=4m−1, and a coordinate i=4m, up to a transfer packet located at a coordinate i=4m−3, and adding the four charges.

After formation of the charge accumulation packets 81 and the empty packets 81, the HS driver 61, the UP driver 62, and the RS driver 63 perform, under control of the control section 57, first drive operation for horizontally transferring the charge accumulation packets 81 and the empty packets 81. In the first drive operation, drive operation is performed such that the charge accumulation packets 81 are transferred to the first branch transfer path 46.

Figure 15A:
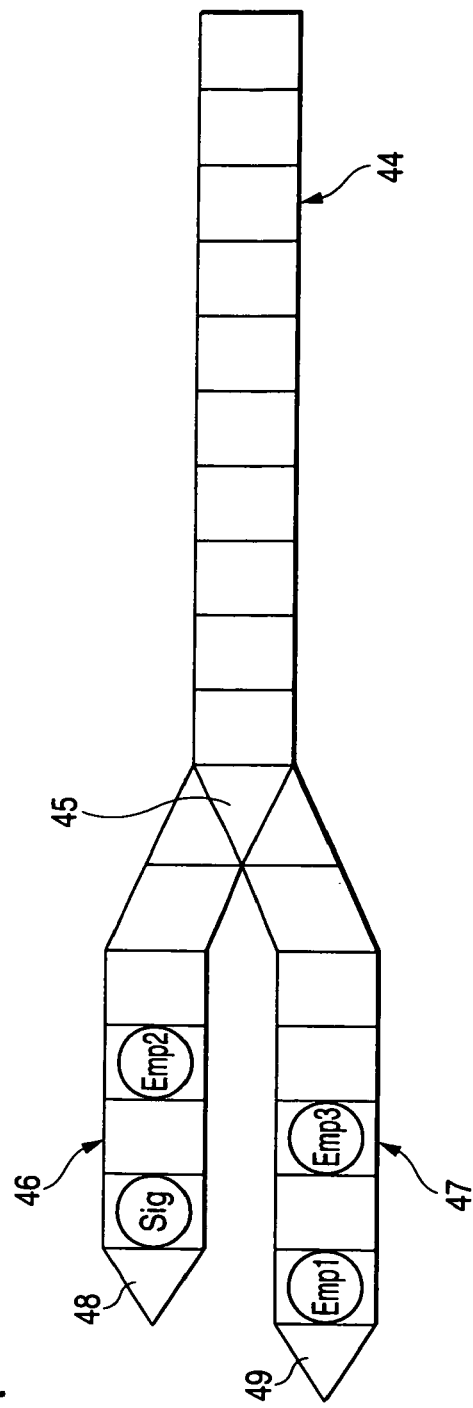
FIG. 15 is a view for describing (a) operation of the horizontal charge transfer path shown in FIG. 9 performed in the correction data generation mode during first drive operation and (b) operation performed during second drive operation.

FIG. 15A shows the state of the first branch transfer path 46 and the state of the second branch transfer path 47 achieved during the first drive operation. As shown in FIG. 15A, the charge accumulation packet 81 (Sig) whose initial position is a coordinate i=4m−3 and the empty packet 81 (Emp2) whose initial position is a coordinate i=4m−1 are present in the first branch transfer path 46. The empty packet 81 (Emp1) whose initial position is a coordinate i=4m−1 and the empty packet 81 (Emp3) whose initial position is a coordinate i=4m are present in the second branch transfer path 47.

Thus, the untransferred charge (3) that is lost from the charge accumulation packet 81 during transfer operation in the first branch transfer path 46 is accumulated in the empty packet 81 (Emp2) whose initial position is the coordinate i=4m−1. Further, the untransferred charge (2), which is lost from the charge accumulation packet 81 when the charge accumulation packet 81 moves from the horizontal charge transfer path 44 to the first branch transfer path 46, and the untransferred charge (5), which is lost from the charge accumulation packet 81 during transfer of the packet up to the final stage of the horizontal charge transfer path 44, are accumulated in the empty packet 81 (Emp1) whose initial position is the coordinate i=4m−2.

After completion of the initial drive operation and the first drive operation, the OFD pulse supply section 59, the V driver 60, the HS driver 61, the HP driver 62, and the RS driver 63 again perform the initial drive operation. Subsequently, the HS driver 61, the HP driver 62, and the RS driver 63 perform second drive operation for horizontally driving the charge accumulation packet 81 and the empty packet 81. In the second drive operation, drive operation is performed so as to transfer the charge accumulation packet 81 to the second branch transfer path 47.

Figure 15B:
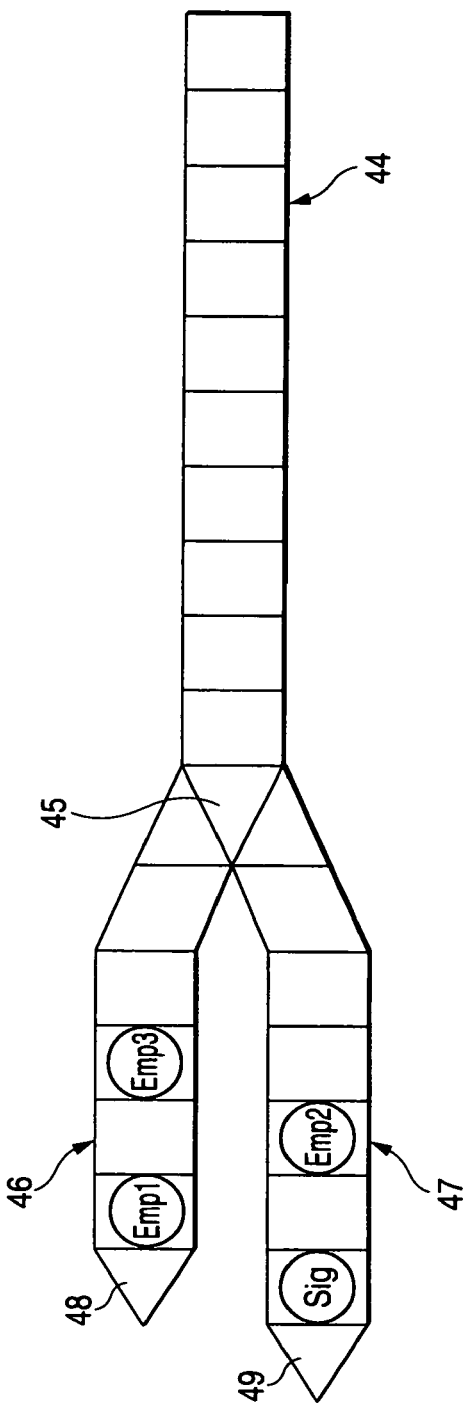

FIG. 15B shows the state of the first branch transfer path 46 and the state of the second branch transfer path 47 achieved during the second drive operation. As shown in FIG. 15B, the charge accumulation packet 81 (Sig) whose initial position is a coordinate i=4m−3 and the empty packet 81 (Emp2) whose initial position is a coordinate i=4m−1 are present in the second branch transfer path 47. The empty packet 81 (Emp1) whose initial position is a coordinate i=4m−1 and the empty packet 81 (Emp3) whose initial position is a coordinate i=4m are present in the first branch transfer path 46.

Thus, the untransferred charge (4) that is lost from the charge accumulation packet 81 during transfer operation in the second branch transfer path 47 is accumulated in the empty packet 81 (Emp2) whose initial position is the coordinate i=4m−1. Further, the untransferred charge (1), which is lost from the charge accumulation packet 81 when the charge accumulation packet 81 moves from the horizontal charge transfer path 44 to the second branch transfer path 47, and the untransferred charge (5), which is lost from the charge accumulation packet 81 during transfer of the packet up to the final stage of the horizontal charge transfer path 44, are accumulated in the empty packet 81 (Emp1) whose initial position is the coordinate i=4m−2.

By means of the first drive operation, the solid-state imaging device 40 outputs a reference signal Q1 responsive to the reference charge still remaining in the charge accumulation packet 81 (the reference signal level is constant regardless of the initial position of the charge accumulation packet 81), an untransferred signal q1 responsive to the untransferred charge (3) left in the empty packet 81 (Emp3) corresponding to the charge accumulation packet 81, and an untransferred signal q2 responsive to the untransferred charges (2) and (5) left in the empty packet 81 (Emp1) corresponding to the charge accumulation packet 81. The thus-output signals are temporarily stored in the memory 56.

By means of the second drive operation, the solid-state imaging device 40 outputs a reference signal Q2 responsive to the reference charge still remaining in the charge accumulation packet 81 (the reference signal level is constant regardless of the initial position of the charge accumulation packet 81), an untransferred signal q3 responsive to the untransferred charge (4) left in the empty packet 81 (Emp3) corresponding to the charge accumulation packet 81 and an untransferred signal q4 responsive to the untransferred charges (1) and (5) left in the empty packet 81 (Emp1) corresponding to the charge accumulation packet 81. The thus-output signals are temporarily stored in the memory 56.

The OFD pulse supply section 59, the V driver 60, the HS drier 61, the HP driver 62, and the RS driver 63 perform the first drive operation and the second drive operation for each of the plurality of exposure conditions by changing the exposure conditions in a plurality of patterns.

When an imaging command is input by way of the operation section 58 in the photographing mode, the OFD pulse supply section 59, the V driver 60, the HS driver 61, the HP driver 62, and the RS driver 63 perform imaging drive operation which includes: exposing the photoelectric conversion elements 41 on set exposure conditions under control of the control section 57; accumulating, in the respective "n" transfer packets 81 formed in the horizontal charge transfer path 43, imaging charges occurred in the respective photoelectric conversion elements 41 by means of exposure; and horizontally transferring the transfer packets 81. By means of the imaging drive operation, the solid-state imaging device 40 outputs imaging signals (the signals are not always of the same level) conforming to the imaging charges remaining the respective transfer packets 81, and the signals are temporarily stored in memory 56.

Turning back to FIG. 8, the signal processing section 70 includes a storage control unit 71; memory 72 formed from a storage medium, such as RAM and ROM; a data interpolation unit 73; a correction function generation unit 74; an untransferred level generation unit 75; and a signal deterioration correction unit 76.

The storage control unit 71 stores, in the memory 72, the reference signal level Q1 acquired from the charge accumulation packet—whose initial position is coordinate i=4m−3 and which is output from the solid-state imaging device 40 by means of the first drive operation and temporarily stored in the memory 56—in association with the untransferred signals q1 and q2 corresponding to the reference signal Q1 and the coordinate i=4m−3. For instance, when the first and second operations are performed on the two exposure conditions R1 and R2 with n=13, the coordinate "i" of the initial position, the reference signal level Q1, and the untransferred signals q1 and q2 are stored, in an associated manner, in the memory 72 for each of the exposure conditions, as shown in FIG. 16.

The storage control unit 71 stores, in the memory 72, the reference signal level Q2 acquired from the charge accumulation packet—whose initial position is coordinate i=4m−3 and which is output from the solid-state imaging device 40 by means of the first drive operation and temporarily stored in the memory 56—in association with the untransferred signals q3 and q4 corresponding to the reference signal Q2 and the coordinate i=4m−3. For instance, when the first and second operations are performed on the two exposure conditions R1 and R2 with n=13, the coordinate "i" of the initial position, the reference signal level Q1, and the untransferred signals q3 and q4 are stored, in an associated manner, in the memory 72 for each of the exposure conditions, as shown in FIG. 17.

In accordance with the data stored in the memory 74, the data interpolation unit 73 performs processing for interpolating the amounts of untransferred signals q1, q2, q3, and q4 corresponding to the coordinates other than the coordinate i=4m−3. The amounts of untransferred signals q1, q2, q3, and q4 acquired under the same exposure conditions are proportional to the value of the coordinate "i" of the initial position. Therefore, the amounts of untransferred signals q1, q2, q3, and q4 corresponding to coordinates other than the coordinate i=4m−3 of the initial position can be readily acquired through linear interpolation.

FIG. 18 is a view showing table acquired after interpolation of the data of the table shown in FIG. 16. Hatched data in FIG. 18 have been interpolated by the data interpolation unit 73. As mentioned previously, the amounts of untransferred signals q1 and q2 acquired under the same exposure conditions are proportional to the value of the coordinate "i" of the initial position. Therefore, the essential requirement is that at least two combinations of the coordinate of the initial position, the untransferred signal level q1, and the untransferred signal level q2 be stored in the memory 72 in connection with the one reference signal level Q1. Likewise, the essential requirement is that at least two combinations of the coordinate of the initial position, the untransferred signal level q3, and the untransferred signal level q4 be stored in connection with the one reference signal level Q2.

Figure 19:
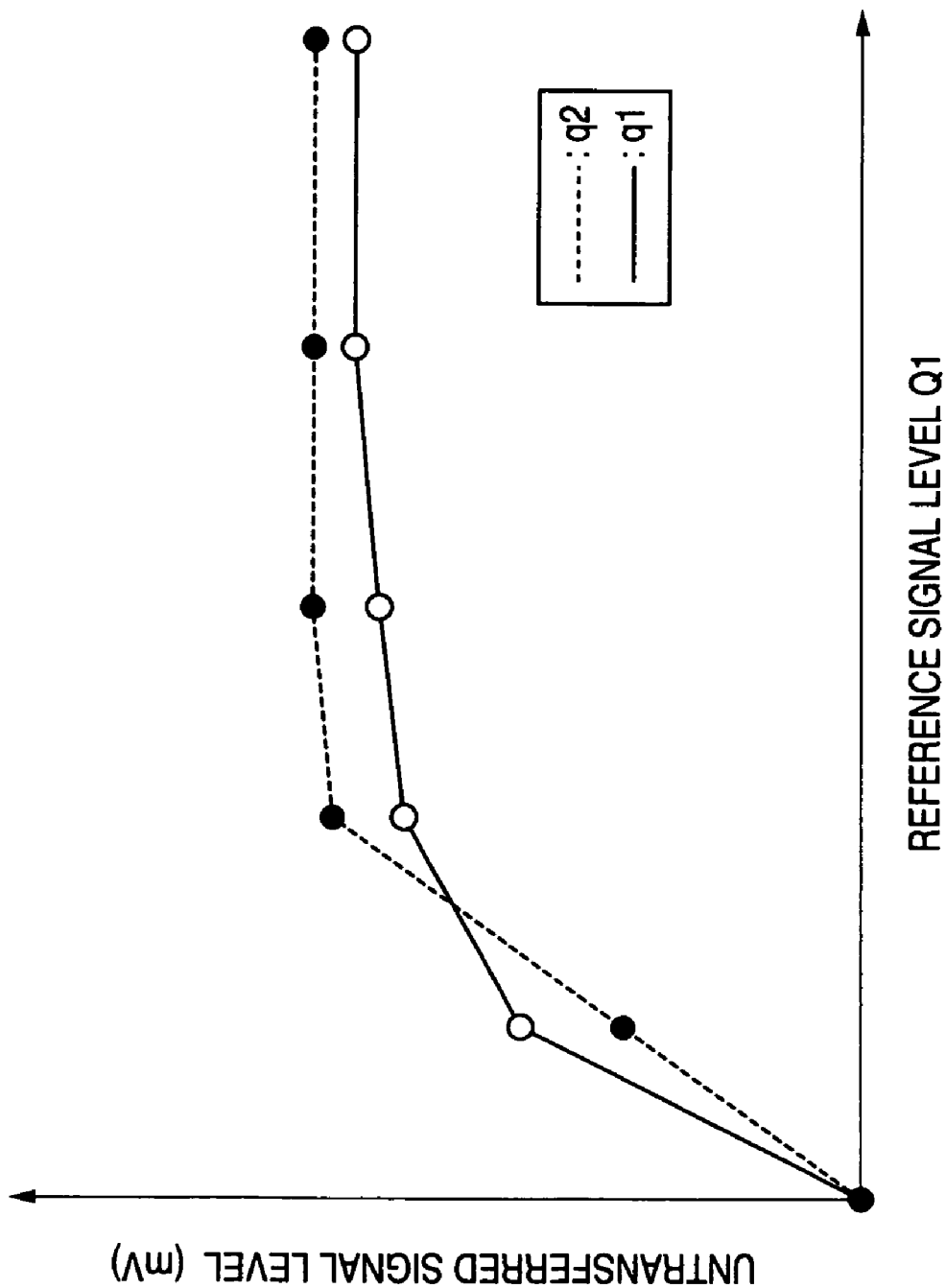
FIG. 19 is a view showing a graph of a correction function generated from the table shown in FIG. 18.

By means of the table shown in FIG. 18, a first graph showing a relationship between the reference signal level Q1 and the corresponding untransferred signal levels q1 and q2 and a second graph showing a relationship between the reference signal level Q2 and the corresponding untransferred signal levels q3 and q4 can be plotted in each of the coordinates. FIG. 19 shows an example graph showing a relationship between the reference signal level Q1 and the corresponding untransferred signal levels q1 and q2. In FIG. 19, an untransferred signal level corresponding to a reference signal level which is not acquired by means of the first drive operation 6 can be acquired through linear interpolation.

The correction function generation unit 74 generates a first correction function which expresses the first graph plotted in each of the coordinates while taking the reference signal level Q1 as a variable and a second correction function which expresses the second graph plotted in each of the coordinates while taking the reference signal level Q2 as a variable. The thus-generated functions are stored in the memory 72.

The untransferred level generation unit 75 acquires, from the memory 56, the imaging signal S(i) responsive to the imaging charge accumulated in the transfer packet 81 which is stored in the memory 56 in accordance with the photographing command issued during the photographing mode and whose initial position has a coordinate "i"; and performs processing in the following two ways according to the value of the coordinate "i."

<a case of "i"=an even number>

The untransferred level generation unit 75 generates an untransferred signal Y11(i)—which is the untransferred signal q1 corresponding to the imaging signal S(i)—from the first correction function generated for the coordinate "i" of the initial position stored in the memory 72 and the amount of signal (signal level) of the acquired imaging signal S(i); and generates an untransferred signal Y12(i) which is an untransferred signal q2 corresponding to the imaging signal S(i).

The untransferred signal Y11(i) is equivalent to a signal level lost from the imaging signal S(i) by the charge transfer failure occurred in the first branch transfer path 46. The untransferred signal Y12(i) is equivalent to a signal level lost from the imaging signal S(i) by the charge transfer failure occurred in the horizontal charge transfer path 44 and the failure to transfer charges from the horizontal charge transfer path 44 to the first branch transfer path 46.

<a case of "i"=an odd number>

The untransferred level generation unit 75 generates an untransferred signal Y21(i)—which is the untransferred signal q4 corresponding to the imaging signal S(i)—from the second correction function generated for the coordinate "i" of the initial position stored in the memory 72 and the amount of signal (signal level) of the acquired imaging signal S(i); and generates an untransferred signal Y22(i) which is an untransferred signal q3 corresponding to the imaging signal S(i).

The untransferred signal Y22(i) is equivalent to a signal level lost from the imaging signal S(i) by the charge transfer failure occurred in the second branch transfer path 47. The untransferred signal Y21(i) is equivalent to a signal level lost from the imaging signal S(i) by the charge transfer failure occurred in the horizontal charge transfer path 44 and the failure to transfer charges from the horizontal charge transfer path 44 to the second branch transfer path 47.

By means of the following correction equations (c) and (d), the signal deterioration correction unit 76 corrects signal deterioration of the imaging signal S(i) responsible for the untransferred charges (3) and (4) in accordance with the untransferred signal generated by the untransferred level generation unit 75. Further, by means of the following correction equations (e) and (f), the signal deterioration correction unit 76 corrects signal deterioration of the imaging signal S(i) responsible for the untransferred charges (1), (2), and (5).

$$X(i)=S(i)+Y11(i)-Y11(i-2)+Z1(i), \text{ where } Y11(0)=0, \text{ "i"=an even number} \quad (c)$$

$$X(i)=S(i)+Y22(i)-Y22(i-2)+Z2(i), \text{ where } Y22(0-1)=0, \text{ "i"=an odd number} \quad (d)$$

X(i): an imaging signal acquired after correction of signal deterioration of the imaging signal S(i) responsible for the untransferred charges (3) and (4)

Z1(i): S(i) is a signal level lost by the reset section of the FD amplifier 48 (an experimentally-known value)

Z2(i): S(i) is a signal level lost by the reset section of the FD amplifier 49 (an experimentally-known value)

$$O(i)=X(i)+Y12(i)-Y21(i-1), \text{ where "i"=an even number} \quad (e)$$

$$O(i)=X(i)+Y21(i)-Y12(i-1), \text{ where } Y12(0)=0, \text{ and "i"=an even number} \quad (f)$$

O(i): an imaging signal acquired after correction of signal deterioration of the imaging signal S(i) responsible for the untransferred electric chares (1), (2), (3), (4), and (5)

A signal lost from the imaging signal S(i) by the untransferred charge (3) can be restored by means of computation represented by "S(i)+Y11(i)" of the correction equation (c). However, computing operation represented by only that portion of the equation results in the imaging signals S(i) acquired from the coordinate i=4 and subsequent coordinates being additionally provided with the untransferred signal Y11 (i−1), and the additions cannot be corrected. For this reason, computing operation represented by "−Y11(i−2)" is further performed to eliminate an additional signal added to the imaging signal S(i). In this way, the signal deterioration correction unit 76 performs computing operation of the correction equation (c), thereby making a correction to signal deterioration responsible for the untransferred charge (3) of the imaging signal S(i).

A signal lost from the imaging signal S(i) by the untransferred charge (4) can be restored by means of computation represented by "S(i)+Y22(i)" of the correction equation (d). However, computing operation represented by only that portion of the equation results in the imaging signals S(i) acquired from the coordinate i=3 and subsequent coordinates being additionally provided with the untransferred signal Y21 (i−2), and the additions cannot be corrected. For this reason, computing operation represented by "−Y22(i−2)" is further performed to eliminate an additional signal added to the imaging signal S(i). In this way, the signal deterioration correction unit 76 performs computing operation of the correction equation (d), thereby making a correction to signal deterioration responsible for the untransferred charge (4) of the imaging signal S(i).

Signals lost from the imaging signal S(i) by the untransferred charges (2) and (5) can be restored by means of computation represented by "X(i)+Y12(i)" of the correction equation (e). However, computing operation represented by only that portion of the equation results in the imaging signal S(i) being additionally provided with the untransferred signal Y21(i−1), and the addition cannot be corrected. For this reason, computing operation represented by "−Y21(i−1)" is further performed to eliminate an additional signal added to the imaging signal S(i). In this way, the signal deterioration correction unit 76 performs computing operation of the correction equation (e), thereby making a correction to signal deterioration responsible for the untransferred charges (2) and (5) of the imaging signal S(i).

Signals lost from the imaging signal S(i) by the untransferred charges (1) and (5) can be restored by means of computation represented by "X(i)+Y21(i)" of the correction equation (f). However, computing operation represented by only that portion of the equation results in the imaging signals S(i) acquired from the coordinate i=3 and subsequent coordinates being additionally provided with the untransferred signal Y12(i−1), and the additions cannot be corrected. For this reason, computing operation represented by "−Y12(i−1)" is further performed to eliminate an additional signal added to the imaging signal S(i). In this way, the signal deterioration correction unit 76 performs computing operation of the correction equation (f), thereby making a correction to signal deterioration responsible for the untransferred charges (1) and (5) of the imaging signal S(i).

Operation of the digital camera configured as mentioned above will be described.

When the digital camera 30 is set to a correction data generation mode, the initial drive operation and the first drive operation are performed for each of the plurality of exposure conditions, and the solid-state imaging device 40 outputs the reference signal Q1 and the untransferred signals q1 and q2. The thus-output signals are temporarily stored in the memory 56. Subsequently, the initial drive operation and the second drive operation are performed for each of the plurality of exposure conditions, and the solid-state imaging device 40 outputs the reference signal Q2 and the untransferred signals q3 and q4. The thus-output signals are temporarily stored in the memory 56.

The table, such as that shown in FIGS. 16 and 17, is compiled from the reference signals Q1 and Q2 and the untransferred signals q1, q2, q3, and q4 stored in the memory 56, and the thus-made table is stored in the memory 72. Data pertaining to the thus-made table are interpolated, whereby the table in the memory 72 are updated as shown in FIG. 18. A first correction function and a second correction function are generated from the table shown in FIG. 18, and the thus-generated functions are stored in the memory 72, whereupon the correction data generation mode is completed. The digital camera 30 is shipped in this state.

When the user who has acquired the thus-shipped digital camera 30 sets the digital camera 30 to a photographing mode, the solid-state imaging device 40 outputs an imaging signal S(i), and the thus-output signal is temporarily stored in the memory 56. Untransferred signals Y11(i), Y12(i), Y21(i), and Y22(i) corresponding to the imaging signal S(i) is generated from the imaging signal S(i) and the first and second correction functions stored in the memory 72.

Next, computing operations of the correction equations (c) to (f) are performed, and signal deterioration of the imaging signal S(i) is corrected. A corrected imaging signal is stored in the memory 56. The signal processing section 70 subjects the corrected imaging signal to digital signal processing, to thus generate image data. After being compressed by the compression-decompression processing section 66, the image data are recorded in the recording medium 68.

As mentioned above, the digital camera 30 stores in the memory 72, for each of the plurality of exposure conditions, in an associated manner the reference signals Q1 and Q2 and the second drive operation, the untransferred signal q1 through q4, which have been output from the solid-state imaging device 40 as a result of performance of the first drive operation, and the coordinate "i" of the initial position. An untransferred signal corresponding to the imaging signal S(i) is generated in accordance with the data stored in the memory 72. Therefore, transfer efficiency of the transfer packet 81 achieved in an actually-used state at each position can be obtained, and signal deterioration of the imaging signal S(i) can be corrected with high accuracy.

Three empty packets 81 are described to be present between the charge accumulation packets 71 formed by the initial drive operation. However, the number of empty packets may also be two or four or more. In any case, no problem arises, so long as the charge accumulation packet 81 is transferred to the first branch transfer path 46 during the first drive operation and so long as the charge accumulation packet 81 is transferred to the second branch transfer path 47 during the second drive operation.

As described in connection with the first embodiment, the charge transfer efficiency of the horizontal charge transfer path 43 is dependent on the temperature. Therefore, the following operations are preferable. Namely, even in the present embodiment, the digital camera 30 is equipped with a temperature sensor for detecting the temperature of the solid-state imaging device 40. The storage control unit 71 acquires information about the temperature of the solid-state imaging device 40 in the correction data generation mode during exposure. The reference signals Q1 and Q2 read from the memory 56 are stored in association with the temperature information. The untransferred level generation unit 75 generates untransferred signals $Y_{11}(i)$, $Y_{12}(i)$, $Y_{21}(i)$, and $Y_{22}(i)$ by use of the information about the temperature of the solid-state imaging device 40 acquired in the photographing mode during exposure.

For instance, provided that a temperature compliant with the table shown in FIGS. 16 and 17 is taken as T1 and that a temperature acquired during exposure in the photographing mode is taken as T2, the essential requirement for the untransferred level generation unit 75 is to perform processing for taking, as final untransferred signals $Y_{11}(i)$, $Y_{12}(i)$, $Y_{21}(i)$, and $Y_{22}(i)$, a value determined by multiplying the generated untransferred signals $Y_{11}(i)$, $Y_{12}(i)$, $Y_{21}(i)$, and $Y_{22}(i)$ by a coefficient $a=a0\times(T2/T1)$ (a0 is an initial value to be determined experimentally). Through processing, the temperature dependence of transfer efficiency can be compensated for. Alternatively, it may also be acceptable that, in the correction data generation mode, the first correction function and the second correction function will be generated, in advance, for each of a plurality of temperatures and that the untransferred signal Y(i) will be generated by the correction function corresponding to the temperature closest to the temperature achieved in the photographing mode.

Moreover, the charge transfer efficiency of the horizontal charge transfer path 43 is also dependent on the drive frequency of the horizontal charge transfer path 43. Therefore, even in the present embodiment, the following operations are preferable. Namely, the storage control unit 71 acquires information about the drive frequency of the horizontal charge transfer path 43 of the solid-state imaging device 40 in the correction data generation mode during exposure. The reference signals Q1 and Q2 read from the memory 56 are stored in association with the information about the drive frequency. The untransferred level generation unit 75 generates untransferred signals $Y_{11}(i)$, $Y_{12}(i)$, $Y_{21}(i)$, and $Y_{22}(i)$ by use of the information about the drive frequency of the horizontal charge transfer path 43 of the solid-state imaging device 40 acquired in the photographing mode during exposure.

For instance, provided that a drive frequency compliant with the table shown in FIGS. 16 and 17 is taken as f1 and that a drive frequency acquired during exposure in the photographing mode is taken as f2, the essential requirement for the untransferred level generation unit 75 is to perform processing for taking, as final untransferred signals $Y_{11}(i)$, $Y_{12}(i)$, $Y_{21}(i)$, and $Y_{22}(i)$, a value determined by multiplying the generated untransferred signals $Y_{11}(i)$, $Y_{12}(i)$, $Y_{21}(i)$, and $Y_{22}(i)$ by a coefficient $b=b0\times(f2/f1)$ (b0 is an initial value to be determined experimentally). Through processing, the drive frequency dependence of transfer efficiency can be compensated for. Alternatively, it may also be acceptable that, in the correction data generation mode, the first correction function and the second correction function will be generated, in advance, for each of a plurality of drive frequencies and that the untransferred signal Y(i) will be generated by the correction function corresponding to the drive frequency closest to the drive frequency achieved in the photographing mode.

In the above descriptions, the digital camera 30 incorporates the storage control unit 71, the data interpolation unit 73, and the correction function generation unit 74. However, processing performed by these sections may also be performed by an external computer, and data obtained through processing can also be stored in the memory 72. Specifically, the storage control unit 71, the data interpolation unit 73, and the correction function generation unit 74 may not be incorporated in the digital camera 30.

While the invention has been described with reference to the exemplary embodiments, the technical scope of the invention is not restricted to the description of the exemplary embodiments. It is apparent to the skilled in the art that various changes or improvements can be made. It is apparent from the description of claims that the changed or improved configurations can also be included in the technical scope of the invention.

This application claims foreign priority from Japanese Patent Application No. 2006-329510, filed Dec. 6, 2006, the entire disclosure of which is herein incorporated by reference.

What is claimed is:

1. An imaging apparatus comprising:
a solid-state imaging device including
a semiconductor substrate,
a plurality of photoelectric conversion elements arranged in the semiconductor substrate,
n vertical charge transfer paths that transfers, in a vertical direction, charges generated in the respective photoelectric conversion elements, wherein n is a natural number of two or more,
a horizontal charge transfer path that transfers, in a horizontal direction orthogonal to the vertical direction, the charges transferred through the n vertical charge transfer path, and
an output section that outputs a signal responsive to the charges transferred through the horizontal charge transfer path,
wherein the horizontal charge transfer path has n transfer packets in regions corresponding to the n vertical transfer paths, provided that each of positions of the n transfer packets are expressed as a coordinate i of a natural number of 1 to n with reference to a position of a transfer packet located closest to the output section;
a signal processing section that makes a correction to the signal output from the solid-state imaging device; and
a storage medium that stores data associating a reference signal and an untransferred signal for each of a plurality of exposure conditions, wherein the data associating the reference signal with the untransferred signal for an exposure condition are stored in such a way that:
a first drive unit performs a first drive operation for exposing the solid-state imaging device under the exposure condition to generate reference charges in the photoelectric conversion elements and accumulating the reference charges in a subset of the n transfer packets, wherein when a transfer packet in the subset accumulating the reference charges are taken as a charge accumulation packet and a transfer packet other than the subset are taken as an empty packet, the solid-state imaging device is driven in such a way that at least one empty packet corresponds to the charge accumulation packet and is formed upstream next to the charge accumulation packet in the horizontal direction;
a second drive unit that performs a second drive operation for transferring, in the horizontal direction, the charge accumulation packet and the empty packet to cause the output section to output a reference signal commensurate with the reference charge in the charge accumulation packet and an untransferred signal commensurate with a charge that is present in an empty packet corresponding to the charge accumulation packet and that has been left from the charge accumulation packet; and
a storage control unit that produce the data associating the reference signal with the untransferred signal and stores the data in the storage medium,
wherein the signal processing section corrects deterioration of an imaging signal S(i) responsive to a charge accumulated in the transfer packet at a coordinate i upon exposure in a photographing mode, based on the data stored in the storage medium and the imaging signal S(i), the deterioration being responsible for a charge transfer failure in the horizontal charge transfer path.

2. The imaging apparatus according to claim 1, wherein the data stored in the storage medium includes: a plurality of untransferred signals among untransferred signals output from the solid-state imaging device upon the exposure; and a coordinate of the charge accumulation packet that is a source of output of the reference signal corresponding to each of the plurality of untransferred signal, the coordinate being achieved before initiation of transfer of the charge accumulation packet, the signal processing section includes:
- an untransferred signal generation unit that interpolates an untransferred signal corresponding to a coordinate other than the coordinate included in the data, with respect to the data stored in the storage medium, so as to produce an interpolated data, and that generates a signal Y(i) of the untransferred signal corresponding to a coordinate and a signal level of the transfer packet serving as a source of output of the imaging signal S(i), from the imaging signal S(i) and a correction function, wherein the correction function is generated from the interpolated data by a correction function generation unit that generates for each of coordinates the correction function expressing the untransferred signal as a function of the reference signal; and
- a correction unit that performs arithmetic operation for adding the signal Y(i) to the imaging signal S(i) and arithmetic operation for subtracting the signal Y(i−1) from the imaging signal S(i), so as to correct the deterioration of the imaging signal S(i).

3. The imaging apparatus according to claim 2, further comprising a temperature detection unit that detects a temperature of the solid-state imaging device, wherein
the storage control unit stores, in the storage medium, information on the temperature of the solid-state imaging device achieved during exposure, in association with the reference signal, and
the untransferred signal generation unit generates the signal Y(i) from the information on a temperature during exposure in the photographing mode as well as the imaging signal S(i) and the correction function.

4. The imaging apparatus according to claim 2, wherein the storage control unit stores, in the storage medium, information on a drive frequency of the horizontal charge transfer path achieved during exposure, in association with the reference signal, and
the untransferred signal generation units generates the signal Y(i) from the information on a drive frequency during exposure in the photographing mode as well as the imaging signal S(i) and the correction function.

5. The imaging apparatus according to claim 1, wherein
the horizontal charge transfer path includes a charge branch path located downward in the horizontal direction with respect to an area where a transfer packet at a coordinate i=1 is to be formed, and is divided into a first horizontal charge transfer path, a second horizontal charge path, and a third horizontal charge path by way of the charge branch path, the third horizontal charge transfer path being located upstream with respect to the charge branch path in the horizontal direction,
the horizontal charge transfer path is driven in such a way that the transfer packet in the third horizontal charge transfer path is transferred alternately to the first horizontal charge transfer path and the second horizontal charge transfer path,
the output section includes: a first output section connected to the first horizontal charge transfer path; and a second output section connected to the second horizontal charge transfer path, and
the first drive unit drives the solid-state imaging device in such a way that at least two empty packets correspond to the charge accumulation packet and are formed upward next to the charge accumulation packet in the horizontal direction.

6. The imaging apparatus according to claim 5, wherein the at least two empty packets are a first empty packet that is an empty packet next to the charge accumulation packet and a second empty packet that is an empty packet next to the first empty packet,
the first drive unit performs the first driving operation twice under the same exposure condition,
the second drive unit performs a third driving operation for transferring the charge accumulation packet formed in one of twice sessions of the first driving operation to the first horizontal charge transfer path and a fourth driving operation for transferring the charge accumulation packet formed by the other of the twice sessions of the first driving operation to the second horizontal charge transfer path,
the storage control unit stores: in the storage medium, a plurality of sets of first data for which a first reference signal acquired from the charge accumulation packet by means of the third driving operation, a first untransferred signal acquired from the first empty packet corresponding to the charge accumulation packet, a second untransferred signal obtained from the second empty packet corresponding to the charge accumulation packet, and a coordinate of the initial position of the charge accumulation packet are associated with one another; and a plurality of sets of second data for which a second reference signal acquired from the charge accumulation packet by means of the fourth driving operation, a third untransferred signal acquired from the first empty packet corresponding to the charge accumulation packet, a fourth untransferred signal obtained from the second empty packet corresponding to the charge accumulation packet, and the coordinate of the initial position of the charge accumulation packet are associated with one another, and
the signal processing unit includes:
- a first untransferred signal generation unit that interpolates the first untransferred signal and the second untransferred signal which correspond to coordinates other than coordinates stored in the storage medium, with respect to the first data, so as to produce a first interpolated data, and that generates a signal $Y_{11}(i)$ of the first untransferred signal corresponding to a coordinate and signal level of the transfer packet serving as a source of output of the imaging signal S(i) and a signal $Y_{12}(i)$ of the second untransferred signal corresponding to a coordinate and signal level of the transfer packet serving as a source of output of the imaging signal S(i), from the imaging signal S(i) output from the first horizontal charge transfer path and a first correction function, wherein the first correction function is generated from the first interpolated data by a first correction function generation unit that generates for each of coordinates the first correction function expressing the first untransferred signal and the second untransferred signal as a function of the first reference signal;
- a second untransferred signal generation unit that interpolates the third untransferred signal and the fourth untransferred signal corresponding to coordinates other than coordinates stored in the storage medium, with respect to the second data, so as to produce a second interpolated data, and that generates a signal $Y_{21}(i)$ of the third untransferred signal corresponding to a coordinate and signal level of the transfer packet serving as a source of output of the imaging signal S(i) and a signal $Y_{22}(i)$ of the fourth untransferred signal corresponding to a coordinate and signal level of the transfer packet serving as a source of output of the imaging signal S(i), from the imaging signal S(i) output from the second horizontal charge transfer pat and a second correction function, wherein the second correction function is generated from the second interpolated data by a second correction function generation unit that generates for each of the coordinates the second correction function expressing the third untransferred signal and the fourth untransferred signal as a function of the second reference signal; and a correction unit that performs arithmetic operation for adding the signal $Y_{11}(i)$ and the signal $Y_{12}(i)$ to the imaging signal $S(i)$ output from the first horizontal charge transfer path, arithmetic operation for subtracting the signal $Y_{11}(i-1)$ and the signal $Y_{12}(i-2)$ from the imaging signal $S(i)$ output from the first horizontal charge transfer path, arithmetic operation for adding the signal $Y_{21}(i)$ and the signal $Y_{22}(i)$ to the imaging signal $S(i)$ output from the second horizontal charge transfer path, and arithmetic operation for subtracting the signal $Y_{21}(i-1)$ and the signal $Y_{22}(i-2)$ from the imaging signal $S(i)$ output from the second horizontal charge transfer path, so as to correct the deterioration of the imaging signal $S(i)$ responsible for transfer deterioration occurred in the first horizontal charge transfer path, the second horizontal charge transfer path, and the third horizontal charge transfer path.

7. The imaging apparatus according to claim 6, further comprising a temperature detection unit that detecting a temperature of the solid-state imaging device, wherein the storage control unit stores, in the storage medium, information on the temperature of the solid-state imaging device achieved during exposure, in association with the first reference signal and the second reference signal, the first untransferred signal generation unit generates the signal $Y_{11}(i)$ and the signal $Y_{12}(i)$ from the information on a temperature during exposure in the photographing mode as well as the imaging signal $S(i)$ output from the first horizontal charge transfer path and the first correction function, and the second untransferred signal generation unit generates the signal $Y_{21}(i)$ and the signal $Y_{22}(i)$ from the information on a temperature during exposure in the photographing mode during exposure as well as the imaging signal $S(i)$ output from the first horizontal charge transfer path and the second correction function.

8. The imaging apparatus according to claim 6, wherein
the storage control unit stores, in the storage medium, information on a drive frequency of the horizontal charge transfer path achieved during exposure, in association with the reference signal and the second reference signal, the first untransferred signal generation unit generates the signal $Y_{11}(i)$ and the signal $Y_{12}(i)$ from the information on a drive frequency during exposure in the photographing mode as well as the imaging signal $S(i)$ output from the first horizontal charge transfer path and the first correction function, and the second untransferred signal generation unit generates the signal $Y_{21}(i)$ and the signal $Y_{22}(i)$ from the information on a drive frequency during exposure in the photographing mode as well as the imaging signal $S(i)$ output from the first horizontal charge transfer path and the second correction function.

9. The imaging apparatus according to claim 1, further comprising the first drive unit, the second drive unit, and the storage control unit.

10. The imaging apparatus according to claim 6, further comprising the first drive unit, the second drive unit, the storage unit, the first correction function generation unit, and the second correction function generation unit.

11. A method for processing a signal output from a solid-state imaging device, the solid-state imaging device comprising:

a semiconductor substrate;

a plurality of photoelectric conversion elements arranged in the semiconductor substrate;

n vertical charge transfer paths that transfers, in a vertical direction, charges generated in the respective photoelectric conversion elements, wherein n is a natural number of two or more;

a horizontal charge transfer path that transfers, in a horizontal direction orthogonal to the vertical direction, the charges transferred through the n vertical charge transfer path; and an output section that outputs the signal responsive to the charges transferred through the horizontal charge transfer path, wherein the horizontal charge transfer path has n transfer packets in regions corresponding to the n vertical transfer paths, provided that each of positions of the n transfer packets are expressed as a coordinate i of a natural number of 1 to n with reference to a position of a transfer packet located closest to the output section, the method comprising:

exposing the solid-state imaging device under an exposure condition to generate reference charge in the photoelectric conversion elements and accumulating the reference charges in a subset of the n transfer packets, wherein when a transfer packet in the subset accumulating the reference charges are taken as a charge accumulation packet and a transfer packet other than the subset are taken as an empty packet, the solid-state imaging device is driven in such a way that at least one empty packet corresponds to the charge accumulation packet and is formed upstream next to the charge accumulation packet in the horizontal direction;

transferring, in the horizontal direction, the charge accumulation packet and the empty packet to cause the output section to output a reference signal commensurate with the reference charge in the charge accumulation packet and an untransferred signal commensurate with a charge that is present in an empty packet corresponding to the charge accumulation packet and that has been left from the charge accumulation packet;

storing data associating the reference signal with the untransferred signal in a storage medium; and correcting deterioration of an imaging signal $S(i)$ responsive to a charge accumulated in the transfer packet at a coordinate i upon exposure in a photographing mode, based on the data stored in the storage medium and the imaging signal $S(i)$, the deterioration being responsible for a charge transfer failure in the horizontal charge transfer path.

* * * * *